(12) United States Patent
Koezuka et al.

(10) Patent No.: US 9,379,223 B2
(45) Date of Patent: Jun. 28, 2016

(54) OXIDE SEMICONDUCTOR FILM, SEMICONDUCTOR DEVICE, AND MANUFACTURING METHOD OF SEMICONDUCTOR DEVICE

(71) Applicant: Semiconductor Energy Laboratory Co., Ltd., Atsugi-shi, Kanagawa-ken (JP)

(72) Inventors: Junichi Koezuka, Tochigi (JP); Yuichi Sato, Isehara (JP); Shinji Ohno, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/570,527

(22) Filed: Dec. 15, 2014

(65) Prior Publication Data

US 2015/0140730 A1 May 21, 2015

Related U.S. Application Data

(62) Division of application No. 13/415,080, filed on Mar. 8, 2012, now Pat. No. 8,927,982.

(30) Foreign Application Priority Data

Mar. 18, 2011 (JP) .................. 2011-060152

(51) Int. Cl.
*H01L 29/66* (2006.01)
*H01L 29/786* (2006.01)
(Continued)

(52) U.S. Cl.
CPC ...... *H01L 29/66969* (2013.01); *H01L 21/0259* (2013.01); *H01L 21/02565* (2013.01); *H01L 21/265* (2013.01); *H01L 29/7869* (2013.01)

(58) Field of Classification Search
CPC ................. H01L 29/7869; H01L 21/02554; H01L 21/02565; H01L 27/1225
See application file for complete search history.

(56) References Cited

U.S. PATENT DOCUMENTS

| 4,259,292 A | 3/1981 | Ichinose et al. |
| 5,371,380 A | 12/1994 | Saito et al. |

(Continued)

FOREIGN PATENT DOCUMENTS

| CN | 001941299 A | 4/2007 |
| CN | 101401213 A | 4/2009 |

(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

(Continued)

*Primary Examiner* — Tucker J Wright
(74) *Attorney, Agent, or Firm* — Robinson Intellectual Property Law Office; Eric J. Robinson

(57) ABSTRACT

A highly reliable semiconductor device is manufactured by giving stable electric characteristics to a transistor in which an oxide semiconductor film is used. In a transistor using an oxide semiconductor film for an active layer, a microvoid is provided in a source region and a drain region adjacent to a channel region. By providing a microvoid in the source region and the drain region formed in an oxide semiconductor film, hydrogen contained in the channel region of an oxide semiconductor film can be captured in the microvoid.

15 Claims, 30 Drawing Sheets

(51) Int. Cl.
  *H01L 21/02* (2006.01)
  *H01L 21/265* (2006.01)

(56) References Cited

U.S. PATENT DOCUMENTS

| | | | |
|---|---|---|---|
| 5,528,032 A | 6/1996 | Uchiyama | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,362,082 B1* | 3/2002 | Doyle et al. | 438/523 |
| 6,563,174 B2 | 5/2003 | Kawasaki et al. | |
| 6,586,802 B2 | 7/2003 | Miyamoto et al. | |
| 6,727,522 B1 | 4/2004 | Kawasaki et al. | |
| 6,879,002 B2 | 4/2005 | Miyamoto et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,145,176 B2 | 12/2006 | Kawasaki et al. | |
| 7,180,108 B2 | 2/2007 | Kawase et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,361,927 B2 | 4/2008 | Kawase et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,821,002 B2 | 10/2010 | Yamazaki et al. | |
| 7,910,490 B2 | 3/2011 | Akimoto et al. | |
| 7,932,521 B2 | 4/2011 | Akimoto et al. | |
| 8,003,981 B2 | 8/2011 | Iwasaki et al. | |
| 8,017,045 B2 | 9/2011 | Cho et al. | |
| 8,110,436 B2 | 2/2012 | Hayashi et al. | |
| 8,183,099 B2 | 5/2012 | Sakata | |
| 8,242,553 B2 | 8/2012 | Korenari et al. | |
| 8,247,813 B2* | 8/2012 | Koyama et al. | 257/43 |
| 8,803,149 B2 | 8/2014 | Sakata | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0052325 A1 | 3/2003 | Miyamoto et al. | |
| 2003/0189401 A1 | 10/2003 | Kido et al. | |
| 2003/0197223 A1 | 10/2003 | Miyamoto et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0042743 A1* | 2/2005 | Kawai et al. | 435/287.2 |
| 2005/0199959 A1 | 9/2005 | Chiang et al. | |
| 2005/0279986 A1 | 12/2005 | Punsalan et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0137740 A1* | 6/2006 | Park et al. | 136/263 |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0069209 A1* | 3/2007 | Jeong et al. | 257/57 |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0117296 A1* | 5/2007 | Giles et al. | 438/197 |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1* | 8/2007 | Hosono et al. | 257/347 |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0032443 A1* | 2/2008 | Wu et al. | 438/104 |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1* | 4/2008 | Pan et al. | 257/347 |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296567 A1* | 12/2008 | Irving et al. | 257/43 |
| 2008/0296568 A1 | 12/2008 | Ryu et al. | |
| 2008/0308796 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0008639 A1 | 1/2009 | Akimoto et al. | |
| 2009/0065771 A1 | 3/2009 | Iwasaki et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0127649 A1 | 5/2009 | Uchiyama | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0155940 A1* | 6/2009 | Lee et al. | 438/29 |
| 2009/0261389 A1 | 10/2009 | Cho et al. | |
| 2009/0278122 A1 | 11/2009 | Hosono et al. | |
| 2009/0280065 A1 | 11/2009 | Hosono et al. | |
| 2009/0305461 A1 | 12/2009 | Akimoto et al. | |
| 2010/0044703 A1* | 2/2010 | Yabuta et al. | 257/43 |
| 2010/0045179 A1 | 2/2010 | Sano et al. | |
| 2010/0065844 A1 | 3/2010 | Tokunaga | |
| 2010/0084655 A1* | 4/2010 | Iwasaki et al. | 257/43 |
| 2010/0092800 A1 | 4/2010 | Itagaki et al. | |
| 2010/0109002 A1 | 5/2010 | Itagaki et al. | |
| 2010/0136743 A1 | 6/2010 | Akimoto et al. | |
| 2010/0159639 A1* | 6/2010 | Sakata | 438/104 |
| 2010/0203673 A1 | 8/2010 | Hayashi et al. | |
| 2010/0237885 A1* | 9/2010 | Meng et al. | 324/717 |
| 2011/0024740 A1 | 2/2011 | Yamazaki et al. | |
| 2011/0024750 A1 | 2/2011 | Yamazaki et al. | |
| 2011/0024751 A1 | 2/2011 | Yamazaki et al. | |
| 2011/0024755 A1 | 2/2011 | Korenari et al. | |
| 2011/0027980 A1 | 2/2011 | Yamazaki et al. | |
| 2011/0031491 A1 | 2/2011 | Yamazaki et al. | |
| 2011/0037068 A1 | 2/2011 | Yamazaki et al. | |
| 2011/0079778 A1 | 4/2011 | Yamazaki et al. | |
| 2011/0104851 A1 | 5/2011 | Akimoto et al. | |
| 2011/0117697 A1 | 5/2011 | Akimoto et al. | |

(56) References Cited

U.S. PATENT DOCUMENTS

| | | | |
|---|---|---|---|
| 2011/0121290 A1 | 5/2011 | Akimoto et al. | |
| 2011/0156022 A1 | 6/2011 | Yamazaki et al. | |
| 2011/0163311 A1 | 7/2011 | Akimoto et al. | |
| 2011/0256684 A1 | 10/2011 | Iwasaki et al. | |
| 2011/0278597 A1* | 11/2011 | Landru | 257/77 |
| 2013/0001557 A1 | 1/2013 | Okazaki et al. | |
| 2015/0037912 A1 | 2/2015 | Sakata | |

FOREIGN PATENT DOCUMENTS

| | | |
|---|---|---|
| CN | 101719514 A | 6/2010 |
| CN | 101809748 A | 8/2010 |
| CN | 101989619 A | 3/2011 |
| CN | 102257621 A | 11/2011 |
| EP | 1562240 A | 8/2005 |
| EP | 1737044 A | 12/2006 |
| EP | 1770788 A | 4/2007 |
| EP | 2175493 A | 4/2010 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 05-291135 A | 11/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289953 A | 10/2002 |
| JP | 2002-305306 A | 10/2002 |
| JP | 2003-086000 A | 3/2003 |
| JP | 2003-086808 A | 3/2003 |
| JP | 2003-257989 A | 9/2003 |
| JP | 2004-103957 A | 4/2004 |
| JP | 2004-273614 A | 9/2004 |
| JP | 2004-273732 A | 9/2004 |
| JP | 2005-223286 A | 8/2005 |
| JP | 2007-096055 A | 4/2007 |
| JP | 2007-123861 A | 5/2007 |
| JP | 2007-250983 A | 9/2007 |
| JP | 2008-103666 A | 5/2008 |
| JP | 2008-141119 A | 6/2008 |
| JP | 2009-099953 A | 5/2009 |
| JP | 2009-224479 A | 10/2009 |
| JP | 2009-260254 A | 11/2009 |
| JP | 2010-093070 A | 4/2010 |
| JP | 2010-166030 A | 7/2010 |
| JP | 2010-199456 A | 9/2010 |
| JP | 2011-049529 A | 3/2011 |
| KR | 2008-0114802 A | 12/2008 |
| KR | 2010-0039806 A | 4/2010 |
| KR | 2011-0104057 A | 9/2011 |
| TW | 201041049 | 11/2010 |
| WO | WO-2004/114391 | 12/2004 |
| WO | WO-2007/119386 | 10/2007 |
| WO | WO-2009/041713 | 4/2009 |
| WO | WO-2010/071034 | 6/2010 |

OTHER PUBLICATIONS

Dembo.H et al., "RFCPUs on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C. ", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N. et al., "Crystallization and Reduction of Sol—Gel-Derived Zinc Oxide Films by Irradiation With Ultraviolet Lamp", Journal of Sol—Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.

Li.C et al., "Modulated Structures of Homologous Compounds $InMo_3(ZnO)_m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of The 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

(56) References Cited

OTHER PUBLICATIONS

Jeong.J et al., "3.1: Distinguished Paper 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUs on Flexible and Glass Substrates for Secure RFID Systems", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs", IDW '09 : Proceedings of The 16th International Display Workshops, 2009, pp. 689-692.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", J. Soc. Inf. Display (Journal of The Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Miyasaka.M, "Suftla Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of The 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", Nirim Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al;B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of The 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

(56) References Cited

OTHER PUBLICATIONS

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of The Electrochemical Society), 2008, vol. 155, No. 12, pp. H1009-H1014.

Ueno.K et al., "Field-Effect Transistors on SrTiO3 With Sputtered Al2O3 Gate Insulator", Appl. Phys. Lett. (Applied Physics Letters), Sep. 1, 2003, vol. 83, No. 9, pp. 1755-1757.

International Search Report (Application No. PCT/JP2012/055734) Dated Apr. 10, 2012.

Written Opinion (Application No. PCT/JP2012/055734) Dated Apr. 10, 2012.

* cited by examiner

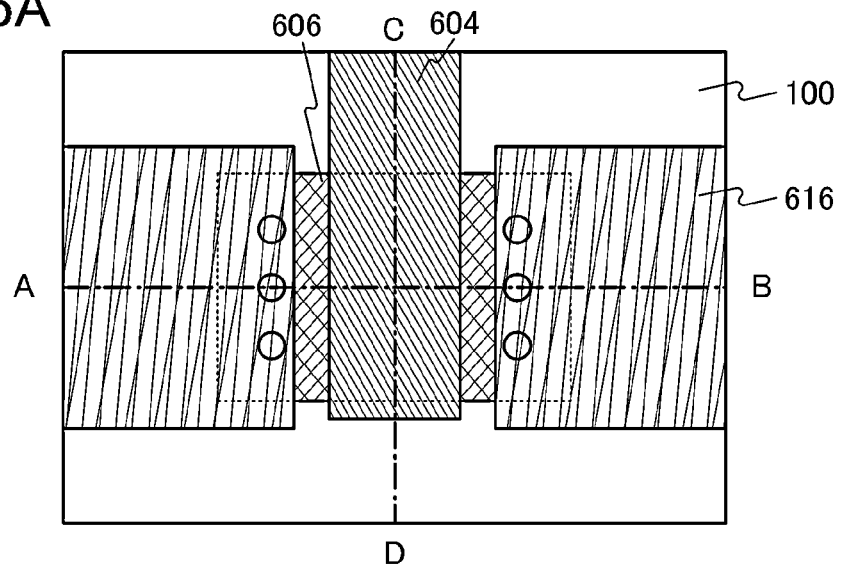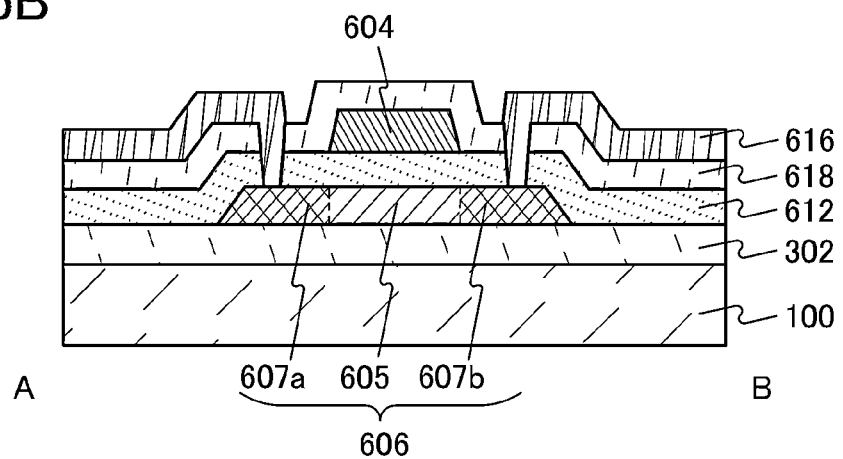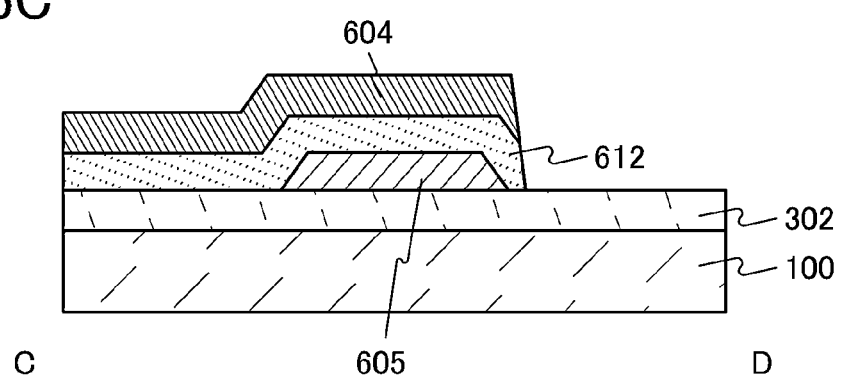

OXIDE SEMICONDUCTOR FILM, SEMICONDUCTOR DEVICE, AND MANUFACTURING METHOD OF SEMICONDUCTOR DEVICE

TECHNICAL FIELD

The present invention relates to a semiconductor device which is provided with a circuit including a semiconductor element such as a transistor. Moreover, the present invention relates to an oxide semiconductor film used in the semiconductor device. For example, the present invention relates to an electronic device which includes, as a component, any of a power device mounted in a power circuit, a semiconductor integrated circuit including a memory, a thyristor, a converter, an image sensor, or the like, an electro-optical device typified by a liquid crystal display device, a light-emitting display device including a light-emitting element, and the like.

In this specification, a semiconductor device generally refers to a device which can function by utilizing semiconductor characteristics; an electrooptic device, a light-emitting display device, a semiconductor circuit, and an electronic device are all included in semiconductor devices.

BACKGROUND ART

Many transistors formed over a glass substrate or the like are manufactured using amorphous silicon, polycrystalline silicon, or the like, as typically seen in liquid crystal display devices. Although transistors including amorphous silicon have low field effect mobility, they can be formed over a larger glass substrate. On the other hand, although transistors including polycrystalline silicon have high field effect mobility, they are not suitable for being formed over a larger glass substrate.

In addition to a transistor formed using silicon, a technique in which a transistor is manufactured using an oxide semiconductor and applied to an electronic device or an optical device has attracted attention. For example, a technique of manufacturing a transistor by using zinc oxide or In—Ga—Zn—O-based oxide as oxide semiconductor, and of using the transistor for a switching element of a pixel of a display device and the like is disclosed in Patent Document 1 and Patent Document 2.

In an oxide semiconductor, part of hydrogen serves as a donor to release electrons as carriers. When the carrier concentration in the oxide semiconductor becomes high, a channel is formed in the transistor without voltage application to a gate. That is, the threshold voltage of a transistor shifts in the negative direction. It is difficult to remove hydrogen in the oxide semiconductor completely; therefore, it is also difficult to control the threshold voltage.

In Patent Document 3, it is disclosed that when hydrogen is added in an oxide semiconductor film, electrical conductivity of the oxide semiconductor is increased by four to five orders of magnitude approximately. Moreover, it is disclosed that hydrogen is diffused into the oxide semiconductor film from an insulating film which is in contact with the oxide semiconductor film.

REFERENCE

[Patent Document 1] Japanese Published Patent Application No. 2007-123861
[Patent Document 2] Japanese Published Patent Application No. 2007-096055
[Patent Document 3] Japanese Published Patent Application No. 2008-141119

DISCLOSURE OF INVENTION

An object of one embodiment of the present invention is to provide an oxide semiconductor film which can capture hydrogen efficiently.

Another object of one embodiment of the present invention is to manufacture a highly reliable semiconductor device in which a transistor including an oxide semiconductor film has stable electric characteristics.

A technical idea of one embodiment of the present invention is to form a microvoid in the oxide semiconductor film.

Another technical idea of one embodiment of the present invention is to form a microvoid in a source region and a drain region adjacent to a channel region in a transistor using an oxide semiconductor film.

It is known that an oxide semiconductor generally has n-type conductivity and part of hydrogen in an oxide semiconductor film serves as a donor and causes release of an electron serving as a carrier. Thus, the use of an oxide semiconductor film for a transistor might cause a shift of the threshold voltage of the transistor in the negative direction. Then, it is necessary to form an oxide semiconductor film containing as little hydrogen as possible; however, it is difficult to suppress entry of a minute amount of hydrogen.

According to one embodiment of the present invention, a microvoid is provided in a source region and a drain region formed in an oxide semiconductor film, so that hydrogen included in a channel region in an oxide semiconductor film can be captured.

The microvoid can be formed by an ion implantation or an ion doping using at least one of a nitrogen ion having a concentration higher than or equal to $1 \times 10^{19}$ cm$^{-3}$ and lower than or equal to $1 \times 10^{22}$ cm$^{-3}$, a hydrogen ion having a concentration higher than or equal to $1 \times 10^{20}$ cm$^{-3}$ and lower than or equal to $3 \times 10^{22}$ cm$^{-3}$, and an oxygen ion having a concentration higher than or equal to $1 \times 10^{20}$ cm$^{-3}$ and lower than or equal to $3 \times 10^{22}$ cm$^{-3}$.

By providing a microvoid, an oxide semiconductor film in which hydrogen can be captured efficiently can be provided.

Hydrogen included in a channel region is captured in a source region and a drain region, whereby stable electric characteristics can be given to a transistor in which an oxide semiconductor film is used, and thus a highly reliable semiconductor device can be manufactured.

BRIEF DESCRIPTION OF DRAWINGS

In the accompanying drawings.

FIGS. 6A to 6C are a top view and cross-sectional views illustrating an example of a transistor according to one embodiment of the present invention;

BEST MODE FOR CARRYING OUT THE INVENTION

Figure 1A:
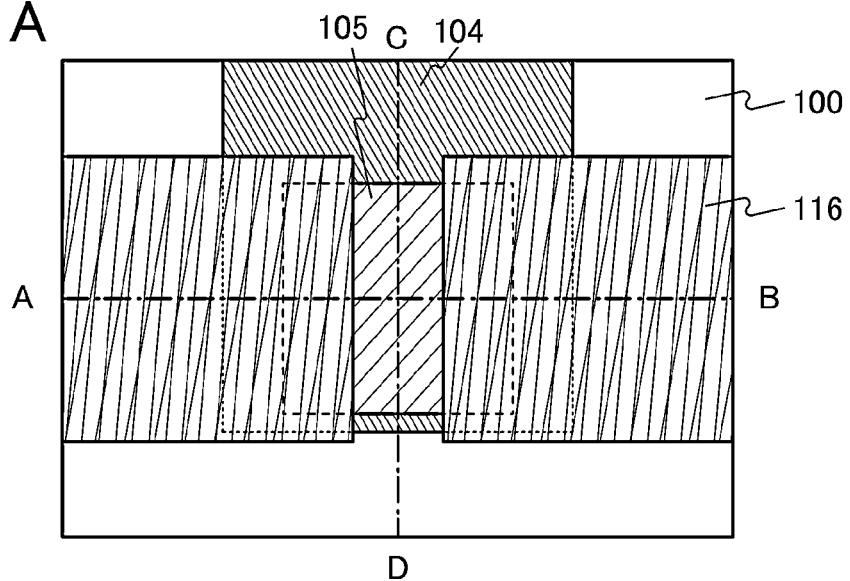
FIGS. 1A to 1C are a top view and cross-sectional views illustrating an example of a transistor according to one embodiment of the present invention.

Hereinafter, embodiments of the present invention are described in detail with reference to the accompanying drawings. However, the present invention is not limited to the description below, and it is easily understood by those skilled in the art that modes and details thereof can be modified in various ways. Therefore, the present invention is not construed as being limited to description of the embodiments. In describing structures of the present invention with reference to the drawings, the same reference numerals are used in common for the same portions in different drawings. Note that the same hatch pattern is applied to similar parts, and the similar parts are not especially denoted by reference numerals in some cases.

Before the present invention is described, terms used in this specification are briefly explained. First, when one of a source and a drain of a transistor is called a drain, the other is called a source in this specification. That is, the source and the drain are not distinguished depending on the potential level. Therefore, a portion called a source in this specification can be alternatively referred to as a drain.

A voltage refers to a potential difference between a given potential and a reference potential (e.g., a ground potential) in many cases. Therefore, a voltage and a potential can be interchanged with each other.

Even when it is written in this specification that "to be connected", there is the case where no physical connection is made in an actual circuit and a wiring is only extended.

Note that the ordinal numbers such as "first" and "second" in this specification are used for convenience and do not denote the order of steps or the stacking order of layers. In addition, the ordinal numbers in this specification do not denote particular names which specify the present invention.

Embodiment 1

In this embodiment, an example of an oxide semiconductor film which is one embodiment of the present invention is described with reference to FIG. 30.

Figure 30:
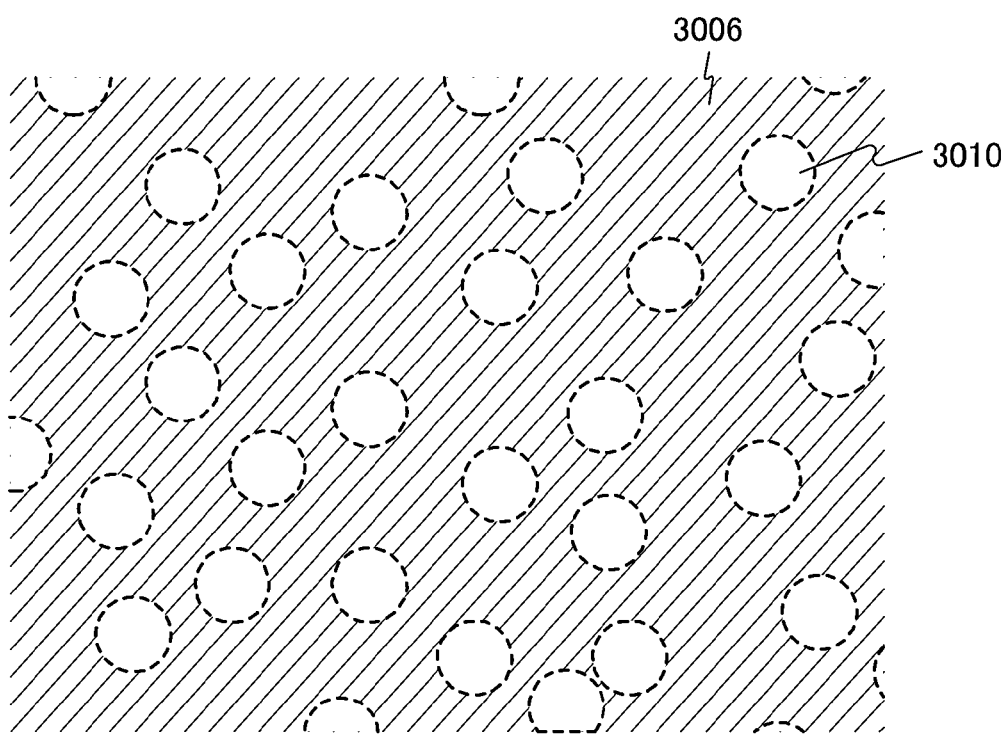
FIG. 30 is a cross-sectional view of an oxide semiconductor film which is one embodiment of the present invention.

FIG. 30 is a cross-sectional view of an oxide semiconductor film 3006. The oxide semiconductor film 3006 has a microvoid 3010, and the microvoid 3010 contains at least one of nitrogen, hydrogen, and oxygen.

For example, for the oxide semiconductor film 3006, an In—Sn—Ga—Zn—O-based material; an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; an In—O-based material; a Sn—O-based material; a Zn—O-based material; or the like may be used. Here, for example, an In—Ga—Zn—O-based material means an oxide containing indium (In), gallium (Ga), and zinc (Zn), and there is no particular limitation on the atomic ratio. Further, the In—Ga—Zn—O-based material may contain an element other than In, Ga, and Zn. In this case, the oxide semiconductor film 3006 preferably contains a larger amount of oxygen than the stoichiometric proportion. When the amount of oxygen is large, generation of carriers which results from oxygen deficiency in the oxide semiconductor film 3006 can be suppressed.

For example, in the case where an In—Zn—O-based material is used as an example of the oxide semiconductor film 3006, the atomic ratio is set so that In/Zn is in a range of from 0.5 to 50, preferably from 1 to 20, more preferably from 3 to 15. When the atomic ratio of Zn is in the above range, the field effect mobility of the transistor can be improved. Here, when the atomic ratio of the compound is In:Zn:O=X:Y:Z, the relation Z>1.5X+Y is satisfied.

Further, a material represented by $InMO_3(ZnO)_m$ (m>0) may be used for the oxide semiconductor film 3006. Here, M represents one or more metal elements selected from Ga, Al, Mn, and Co. For example, M may be Ga, Ga and Al, Ga and Mn, Ga and Co, or the like.

The microvoid provided in the oxide semiconductor film 3006 has a low density as compared to the surrounding thereof or an empty space. The microvoid is substantially a spherical region where the diameter is larger than or equal to 0.1 nm and smaller than or equal to 10 nm, preferably larger than or equal to 2 nm and smaller than or equal to 7 nm, or a region where a plurality of spherical regions overlaps each other. For example, such a spherical microvoid whose diameter is 10 nm can capture 1 to 20000 nitrogen molecules whose diameter is 0.375 nm and oxygen molecules whose diameter is 0.364 nm, and 1 to 40000 hydrogen molecules whose diameter is 0.29 nm In the oxide semiconductor film 3006, the region where the microvoid is provided has a low density as compared to the other region where the microvoid is not provided.

A gas molecule such as nitrogen, oxygen, and hydrogen can be captured into the microvoid provided in the oxide semiconductor film 3006. In order to capture more gas molecules such as nitrogen, oxygen, and hydrogen, for example, heat treatment may be performed at a temperature higher than or equal to 200° C. and lower than or equal to 700° C., preferably at a temperature higher than or equal to 300° C. and lower than or equal to 650° C., after the microvoid is formed.

An oxide semiconductor film 3006 is in a single crystal state, a polycrystalline (also referred to as polycrystal) state, an amorphous state, or the like.

An oxide semiconductor film 3006 is preferably a CAAC-OS (c-axis aligned crystalline oxide semiconductor) film.

The CAAC-OS film is not completely single crystal nor completely amorphous. The CAAC-OS film is an oxide semiconductor film having a crystal-amorphous mixed structure in which an amorphous phase includes a crystal portion and an amorphous portion. Note that in most cases, the crystal portion fits inside a cube whose one side is less than 100 nm From an observation image obtained with a transmission electron microscope (TEM), a boundary between an amorphous portion and a crystal portion in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal portions included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal portions, the directions of the a-axis and the b-axis of one crystal portion may be different from those of another crystal portion. In this specification, a simple term "perpendicular" includes a range from 85° to 95°. In addition, a simple term "parallel" includes a range from −5° to 5°.

In the CAAC-OS film, distribution of crystal portions is not necessarily uniform. For example, in the formation process of the CAAC-OS film, in the case where crystal growth occurs from a surface side of the oxide semiconductor film, the proportion of crystal portions in the vicinity of the surface of the oxide semiconductor film is higher than that in the vicinity of the surface where the oxide semiconductor film is formed in some cases. Further, when an impurity is added to the CAAC-OS film, the crystal portion in a region to which the impurity is added becomes amorphous in some cases.

Since the c-axes of the crystal portions included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal portion is the direction parallel to a normal vector of the surface where the CAAC-OS film is formed or a normal vector of the surface of the CAAC-OS film. The crystal portion is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

The crystal portion included in the CAAC-OS film is more likely to be formed near the vicinity of the surface of the film. An oxide semiconductor film including a microvoid as in one embodiment of the present invention has many surfaces in the film, thereby a crystal portion as appeared in the CAAC-OS film is readily obtained.

Note that the oxide semiconductor film is formed by a sputtering method, a plasma CVD method, a pulse laser deposition method (PLD), a molecular beam epitaxy method (MBE), or an evaporation method, and after that, the microvoid 3010 is provided by adding an ion, so that the oxide semiconductor film 3006 can be formed. For ion addition, at least one of a nitrogen ion having a concentration higher than or equal to $1\times10^{19}$ cm$^{-3}$ and lower than or equal to $1\times10^{22}$ cm$^{-3}$, a hydrogen ion having a concentration higher than or equal to $1\times10^{20}$ cm$^{-3}$ and lower than or equal to $3\times10^{22}$ cm$^{-3}$, or an oxygen ion having a concentration higher than or equal to $1\times10^{20}$ cm$^{-3}$ and lower than or equal to $3\times10^{22}$ cm$^{-3}$ is used. After a nitrogen ion or an oxygen ion is added, a hydrogen ion may be added. The addition of a nitrogen ion, a hydrogen ion, and/or an oxygen ion may be performed by an ion implantation method or an ion doping method; the ion doping method is preferably used. For example, when a nitrogen ion is added, an $NH_X$ (X is a natural number) ion may be added by an ion doping method. An ion doping method is preferable in that it takes a time shorter than that by an ion implantation method.

Next, by performing heat treatment at a temperature higher than or equal to 200° C. and lower than or equal to 700° C., hydrogen can be captured into the microvoid 3010 from inside and outside the oxide semiconductor film 3006.

According to this embodiment, an oxide semiconductor film having the microvoid which can capture hydrogen.

This embodiment can be implemented in appropriate combination with the other embodiments.

Embodiment 2

In this embodiment, an example of a transistor which is a semiconductor device according to an embodiment of the present invention is described with reference to FIGS. 1A to 1C.

FIG. 1A is a top view of the transistor. A cross section along dashed-dotted line A-B in FIG. 1A and a cross section along dashed-dotted line C-D in FIG. 1A correspond to a cross section A-B in FIG. 1B and a cross section C-D in FIG. 1C, respectively.

Figure 1B:
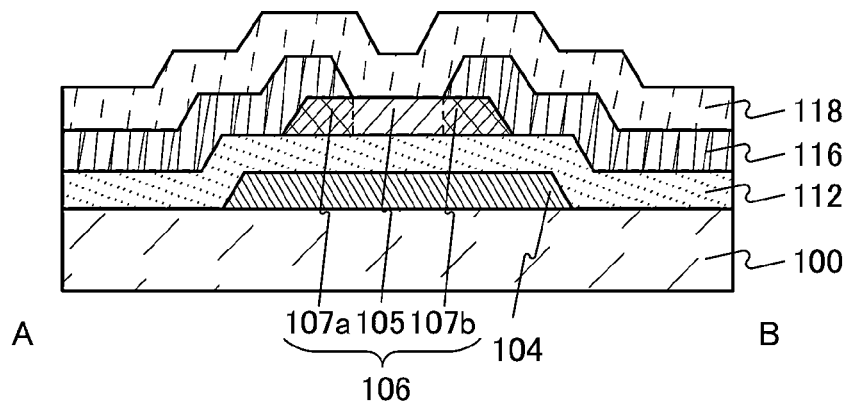

Here, the cross section A-B in FIG. 1B is described in detail.

The transistor includes a substrate 100, a gate electrode 104 over the substrate 100, a gate insulating film 112 covering the gate electrode 104, an oxide semiconductor film 106 including a channel region 105, a source region 107a, and a drain region 107b over the gate electrode 104 with the gate insulating film 112 provided therebetween, and a pair of electrodes 116 over the oxide semiconductor film 106 to be partly in contact with the oxide semiconductor film 106. Note that it is preferable to have an interlayer insulating film 118 over the oxide semiconductor film 106 so that the channel region 105 in the oxide semiconductor film 106 is not exposed.

The oxide semiconductor film 106 may have the same structure as the oxide semiconductor film 3006 described in Embodiment 1.

Here, by adding at least one of a nitrogen ion having a concentration higher than or equal to $1 \times 10^{19}$ cm$^{-3}$ and lower than or equal to $1 \times 10^{22}$ cm$^{-3}$, a hydrogen ion having a concentration higher than or equal to $1 \times 10^{20}$ cm$^{-3}$ and lower than or equal to $3 \times 10^{22}$ cm$^{-3}$, and an oxygen ion having a concentration higher than or equal to $1 \times 10^{20}$ cm$^{-3}$ and lower than or equal to $3 \times 10^{22}$ cm$^{-3}$ to a part of the oxide semiconductor film 106, a microvoid is provided in the oxide semiconductor film 106. A resist mask may be formed over the oxide semiconductor film 106 in order to add the ion selectively.

The oxide semiconductor film 106 bonds to hydrogen, and may form an electron serving as a carrier. Therefore, when hydrogen is captured in the microvoid, the sheet resistance in a region around the microvoid is decreased approximately from $1 \times 10^5$ Ω/sq to $1 \times 10^7$ Ω/sq (preferably approximately from $1 \times 10^4$ Ω/sq to $1 \times 10^6$ Ω/sq), so that the source region 107a and the drain region 107b are formed. Moreover, the other region where no microvoid is formed functions as the channel region 105.

At this time, hydrogen included in the channel region 105 and a film which is in contact with the oxide semiconductor film 106 is captured in the microvoid in the source region 107a and the drain region 107b. Thus, it is possible to lower the hydrogen concentration in the channel region 105 and the vicinity thereof as much as possible, so that the channel region 105 is highly purified.

The hydrogen concentration in the channel region 105 is less than $5 \times 10^{18}$ cm$^{-3}$, preferably less than or equal to $1 \times 10^{18}$ cm$^{-3}$, more preferably less than or equal to $5 \times 10^{17}$ cm$^{-3}$, and still more preferably less than or equal to $1 \times 10^{16}$ cm$^{-3}$.

Here, an alkali metal is not an element included in an oxide semiconductor, and therefore, is an impurity. In addition, an alkaline earth metal is also an impurity in the case where the alkaline earth metal is not included in an oxide semiconductor. An alkali metal, in particular, Na diffuses in an insulating film which is in contact with the oxide semiconductor film and Na becomes Na$^+$. In addition, in the oxide semiconductor film, Na cuts or enters a bond between a metal and oxygen which are included in the oxide semiconductor. As a result, for example, deterioration of characteristics of the transistor such as a normally-on state of the transistor due to shift of a threshold voltage in the negative direction or a reduction in field-effect mobility occurs; in addition, variation in characteristics is also caused. Such deterioration of characteristics of the transistor and variation in characteristics due to the impurity remarkably appear when the concentration of hydrogen in the oxide semiconductor film is sufficiently low. Therefore, when the concentration of hydrogen in the oxide semiconductor film is less than or equal to $1 \times 10^{18}$ cm$^{-3}$, or less than or equal to $1 \times 10^{17}$ cm$^{-3}$, the concentration of impurity is preferably reduced. Specifically, the measurement value of Na concentration is lower than or equal to $5 \times 10^{16}$ cm$^{-3}$, preferably lower than or equal to $1 \times 10^{16}$ cm$^{-3}$, more preferably lower than or equal to $1 \times 10^{15}$ cm$^{-3}$. In addition, the measurement value of lithium (Li) concentration is preferably $5 \times 10^{15}$/cm$^{-3}$ or less, more preferably $1 \times 10^{15}$/cm$^{-3}$ or less. In addition, the measurement value of potassium (K) concentration is preferably less than or equal to $5 \times 10^{15}$ cm$^{-3}$, more preferably less than or equal to $1 \times 10^{15}$ cm$^{-3}$.

The off-state current of the above-described transistor in which the channel region 105 is formed is extremely small. For example, the off-state current of the transistor where the channel length is 3 μm and the channel width is 1 μm is less than or equal to $1 \times 10^{-18}$ A, less than or equal to $1 \times 10^{-21}$ A, or less than or equal to $1 \times 10^{-24}$ A.

For the oxide semiconductor film 106, for example, a material containing two or more elements selected from In, Ga, Zn, and Sn may be used.

As for the oxide semiconductor film 106, a material which has a band gap of 2.5 eV or more, preferably has a band gap of 3.0 eV or more, is selected in order to reduce the off-state current of the transistor. Instead of an oxide semiconductor film, any other semi conductive material which has a band gap within the above range may be used.

For the gate insulating film 112 and the interlayer insulating film 118, silicon nitride, aluminum oxide, hafnium oxide, yttrium oxide, zirconium oxide, and the like may be used with a single layer or a stacked layer. For example, the gate insulating film 112 and the interlayer insulating film 118 may be formed by a plasma CVD method, a sputtering method, or the like. As each of the gate insulating film 112 and the interlayer insulating film 118, a film from which oxygen is released by heat treatment may be preferably used. With the use of such a film from which oxygen is released by heat treatment, defects generated in the channel region 105 can be repaired and deterioration in electric characteristics of the transistor can be suppressed.

In this embodiment, as the gate insulating film 112 and the interlayer insulating film 118, an insulating film including hydrogen with a concentration which is higher than or equal to $1 \times 10^{20}$ cm$^{-3}$ and lower than or equal to $3 \times 10^{22}$ cm$^{-3}$ may be used. A transistor in which a conventional oxide semiconductor film is used in a channel region has been pointed that the hydrogen concentration in the vicinity of the oxide semiconductor film needs to be small as much as possible. However, by applying an embodiment of the present invention, hydrogen can be captured in the source region 107a and the drain region 107b provided with a microvoid. Therefore, as the gate insulating film 112 and the interlayer insulating film 118, even an insulating film including hydrogen with a high concentration may be used, whereby the resistance in the source region 107a and the drain region 107b can be reduced by hydrogen which is supplied from the gate insulating film 112 and the interlayer insulating film 118. Such an insulating film including hydrogen with a concentration which is higher than or equal to $1 \times 10^{20}$ cm$^{-3}$ and lower than or equal to $3 \times 10^{22}$ cm$^{-3}$ can be formed, for example, by a plasma CVD method in an atmosphere in which silane and nitrous oxide are mixed. Alternatively, the insulating film can be formed by a sputtering method in an atmosphere in which argon, oxygen, and hydrogen are mixed.

To release oxygen by heat treatment means that the amount of released oxygen which is converted to oxygen atoms is greater than or equal to $1.0 \times 10^{18}$ cm$^{-3}$, preferably greater than or equal to $1.0 \times 10^{20}$ cm$^{-3}$, in thermal desorption spectroscopy (TDS) analysis.

Here, a method of the amount of released oxygen using TDS analysis is described.

The amount of released gas in TDS analysis is proportional to the integral value of ion intensity. Therefore, the amount of released gas can be calculated from the ratio between the integral value of measured ion intensity and the reference value of a standard sample. The reference value of a standard sample refers to the ratio of the density of a predetermined atom contained in a sample to the integral value of ion intensity.

For example, the number of the released oxygen molecules ($N_{O2}$) from an insulating film can be found according to a Formula 1 with the TDS analysis results of a silicon wafer containing hydrogen at a predetermined density which is the standard sample and the TDS analysis results of the insulating film. Here, all gases having a mass number of 32 which are obtained by the TDS analysis are assumed to originate from an oxygen molecule. CH$_3$OH, which is given as a gas having a mass number of 32, is not taken into consideration on the assumption that it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2}=N_{H2}/S_{H2} \times S_{O2} \times \alpha \quad \text{(Formula 1)}$$

$N_{H2}$ is the value obtained by conversion of the number of hydrogen molecules desorbed from the standard sample into densities. $S_{H2}$ is the integral value of ion intensity when the standard sample is subjected to TDS analysis. Here, the reference value of the standard sample is set to $N_{H2}/S_{H2}$. $S_{O2}$ is the integral value of ion intensity when the insulating film is subjected to TDS analysis. $\alpha$ is a coefficient which influences ion intensity in TDS analysis. Refer to Japanese Published Patent Application No. H06-275697 for details of Formula 1. Note that the amount of released oxygen from the insulating film is measured with a thermal desorption spectroscopy apparatus produced by ESCO Ltd., EMD-WA1000S/W using a silicon wafer containing hydrogen atoms at $1 \times 10^{16}$ cm$^{-3}$ as the standard sample.

Further, in the TDS analysis, oxygen is partly detected as an oxygen atom. The ratio between oxygen molecules and oxygen atoms can be calculated from the ionization rate of the oxygen molecules. Note that, since the above $\alpha$ includes the ionization rate of the oxygen molecules, the number of the released oxygen atoms can also be estimated through the evaluation of the number of the released oxygen molecules.

Note that $N_{O2}$ is the number of the released oxygen molecules. The amount of released oxygen when converted into oxygen atoms is twice the number of the released oxygen molecules.

In the above structure, the film from which oxygen is released by heat treatment may be oxygen-excess silicon oxide (SiO$_X$(X>2)). In the oxygen-excess silicon oxide (SiO$_X$ (X>2)), the number of oxygen atoms per unit volume is more than twice the number of silicon atoms per unit volume. The number of silicon atoms and the number of oxygen atoms per unit volume are measured by Rutherford backscattering spectrometry (RBS).

Oxygen is supplied to the channel region 105 from the gate insulating film 112 and the interlayer insulating film 118, thereby the interface state density between the channel region 105 and the gate insulating film 112, and the interface state density between the channel region 105 and the interlayer insulating film 118 can be reduced. As a result, carrier trapping at the interface between the channel region 105 and the gate insulating film 112, and the interface between the channel region 105 and the interlayer insulating film 118 can be suppressed, and thus a transistor with less degradation in electric characteristics can be obtained.

Further, in some cases, charge is generated due to oxygen deficiency in the channel region 105. In general, part of oxygen vacancy in an oxide semiconductor film serves as a donor and causes release of an electron which is a carrier. As a result, the threshold voltage of a transistor shifts in the negative direction. Oxygen is sufficiently supplied from the gate insulating film 112 or the interlayer insulating film 118 to the channel region 105, whereby the oxygen vacancy in the channel region 105, which causes the negative shift of the threshold voltage, can be reduced.

In other words, a film from which oxygen is released by heat treatment is provided for the gate insulating film 112 or the interlayer insulating film 118, the interface state density at an interface between the channel region 105 and the gate insulating film 112 or the interface state density at an interface between the channel region 105 and the interlayer insulating film 118 and the oxygen vacancy in the channel region 105 can be reduced. Thus, the influence of carrier trapping at the interface between the channel region 105 and the gate insulating film 112 or at the interface between the channel region 105 and the interlayer insulating film 118 can be reduced.

Thus, the threshold voltage of the transistor may shift in the negative direction due to various causes. Therefore, it is preferable that the hydrogen concentration in the channel region 105 is reduced while oxygen deficiency is reduced.

There is no particular limitation on the substrate 100 as long as it has heat resistance enough to withstand at least heat treatment performed later. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 100. Still alternatively, any of these substrates further provided with a semiconductor element may be used as the substrate 100.

As the substrate 100, a flexible substrate may be used. In that case, the transistor may be formed directly over the flexible substrate. Note that to provide a transistor on the flexible substrate, there is also a method in which a transistor is formed over a non-flexible substrate, and the transistor is separated and transferred to the substrate 100 which is a flexible substrate. In that case, a separation layer is preferably provided between the non-flexible substrate and the transistor.

The gate electrode 104 may be formed to have a single layer structure or a stacked structure, using at least one of the following materials: Al, Ti, Cr, Co, Ni, Cu, Y, Zr, Mo, Ag, Ta, and W; a nitride of any of these elements; an oxide of any of these elements; and an alloy of any of these elements. Further, in the case where an oxide is used as the gate electrode 104, the oxide may include nitrogen which is greater than or equal to $5\times10^{19}$ cm$^{-3}$ and less than or equal to 20 atomic %, preferably greater than or equal to $1\times10^{20}$ cm$^{-3}$ and less than or equal to 7 atomic %. For example, an oxide film which contains nitrogen at higher than or equal to $1\times10^{20}$ cm$^{-3}$ and lower than or equal to 7 at. % and also contains In, Ga, and Zn may be used. Since an oxide film has higher resistance than a metal film, in the case of using an oxide film as the gate electrode 104, it is preferable to use a stacked structure of the oxide film and a low-resistance film with a sheet resistance of 10 Ω/sq or lower in order to reduce resistance of the whole gate electrode 104. The concentration which is represented by the unit cm$^{-3}$ can be quantified by secondary ion mass spectrometry (SIMS), and the concentration which is represented by the unit atomic % can be quantified by X-ray photoelectron spectroscopy (XPS).

Figure 1C:
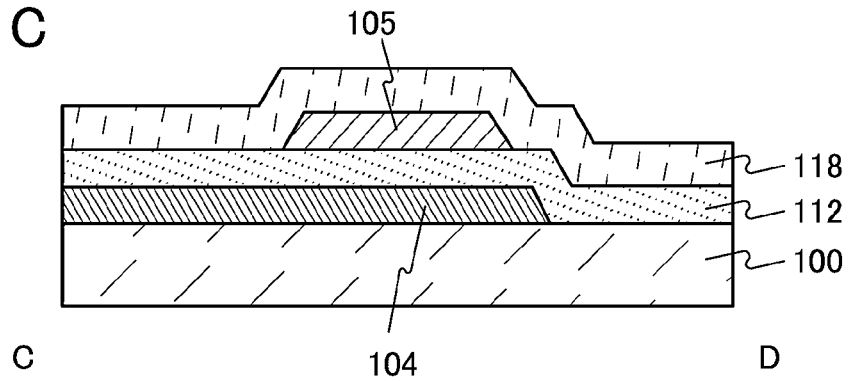

In FIGS. 1A to 1C, the gate electrode 104 is larger than the oxide semiconductor film 106 in length and width, so that degradation and generation of electric charge due to light are suppressed in the oxide semiconductor film 106; however, the present invention is not limited to this structure. For example, the oxide semiconductor film 106 may be larger than the gate electrode 104 in length and width in the top view.

The pair of electrodes 116 may be formed with a single layer structure or a stacked structure using a metal film, a metal nitride film, a metal oxide film, an alloy film, or the like given for the gate electrode 104.

When a film containing Cu is used for the pair of electrodes 116, the resistance of a wiring can be reduced, and generation of wiring delays or the like even in a large-sized display device can be reduced. In the case of using Cu for the pair of electrodes 116, the adhesion depends on the material of the substrate 100; in such a case, it is preferable to employ a stacked-layer structure using a film having favorable adhesion property to the substrate 100. As a film with high adhesion to the substrate 100, a film containing Ti, Mo, Mn, Al, or the like may be used. For example, a Cu—Mn—Al alloy may be used.

Next, a method for manufacturing the transistor illustrated in FIGS. 1A to 1C is described with reference to FIGS. 14A to 14D.

First, a conductive film is formed over the substrate 100 by a sputtering method, an evaporation method, or the like, and is processed to form the gate electrode 104. Next, the gate insulating film 112 covering the gate electrode 104 is formed (see FIG. 14A).

Figure 14A:
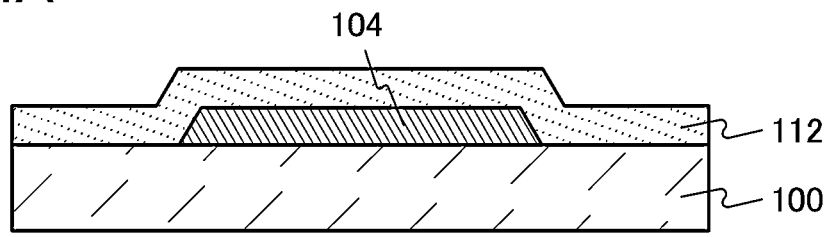
FIGS. 14A to 14D are cross-sectional views each illustrating an example of a manufacturing method of a transistor according to one embodiment of the present invention.
Figure 14B:
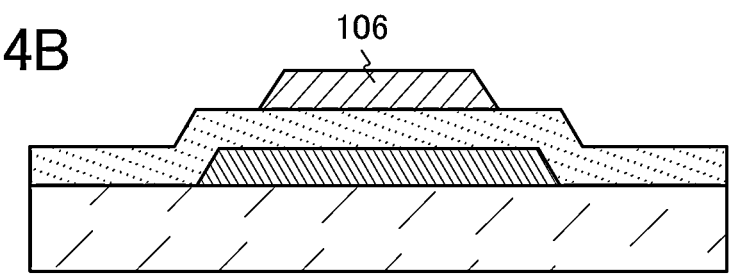
Figure 14C:
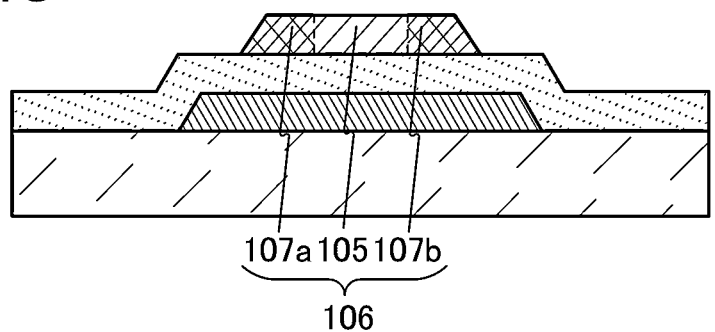
Figure 14D:
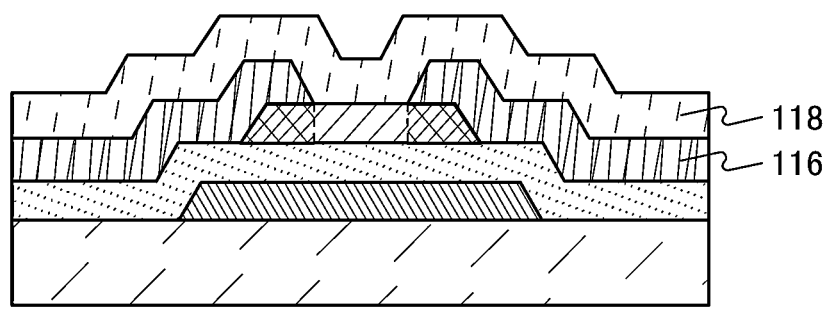

Next, an oxide semiconductor film is formed over the gate electrode 104 with the gate insulating film 112 provided therebetween, and is processed to form the oxide semiconductor film 106 (see FIG. 14B).

Then, a resist mask or the like is formed over the oxide semiconductor film 106, and at least one of a nitrogen ion having a concentration higher than or equal to $1\times10^{19}$ cm$^{-3}$ and lower than or equal to $1\times10^{22}$ cm$^{-3}$, a hydrogen ion having a concentration higher than or equal to $1\times10^{20}$ cm$^{-3}$ and lower than or equal to $3\times10^{22}$ cm$^{-3}$, and an oxygen ion having a concentration higher than or equal to $1\times10^{20}$ cm$^{-3}$ and lower than or equal to $3\times10^{22}$ cm$^{-3}$ is added to a part of the oxide semiconductor film 106. By the addition, a microvoid can be formed in the part of the oxide semiconductor film 106. Then, heat treatment at a temperature higher than or equal to 200° C. and lower than or equal to 700° C., preferably at a temperature higher than or equal to 300° C. and lower than or equal to 650° C. is performed thereon, so that hydrogen is captured in the microvoid. In this manner, the channel region 105, the source region 107a, and the drain region 107b are formed (see FIG. 14C).

Next, a conductive film is formed by a sputtering method, an evaporation method, or the like, and is processed to form a pair of electrodes 116 to be in contact with a part of the oxide semiconductor film 106. Moreover, the interlayer insulating film 118 may be formed over the oxide semiconductor film 106 and the pair of electrodes 116 (see FIG. 14D).

As described above, a microvoid can be formed by adding an ion to a part of the oxide semiconductor film 106, and hydrogen can be captured in the microvoid by heat treatment, thereby a resistance in the vicinity of a formation region of the microvoid is reduced to form the source region 107a and the drain region 107b. At the same time, hydrogen is removed from the region in the oxide semiconductor film 106 other than the source region 107a and the drain region 107b to form the channel region 105 which is high purified. Accordingly, a high reliability semiconductor device having stable electric characteristics, in which the off-state current of the transistor is extremely small, can be manufactured.

Through the above-described process, the transistor illustrated in FIGS. 1A to 1C can be manufactured.

This embodiment can be implemented in appropriate combination with the other embodiments.

Embodiment 3

In this embodiment, a transistor having a structure different from that of the transistor described in Embodiments 2 is described.

Figure 2A:
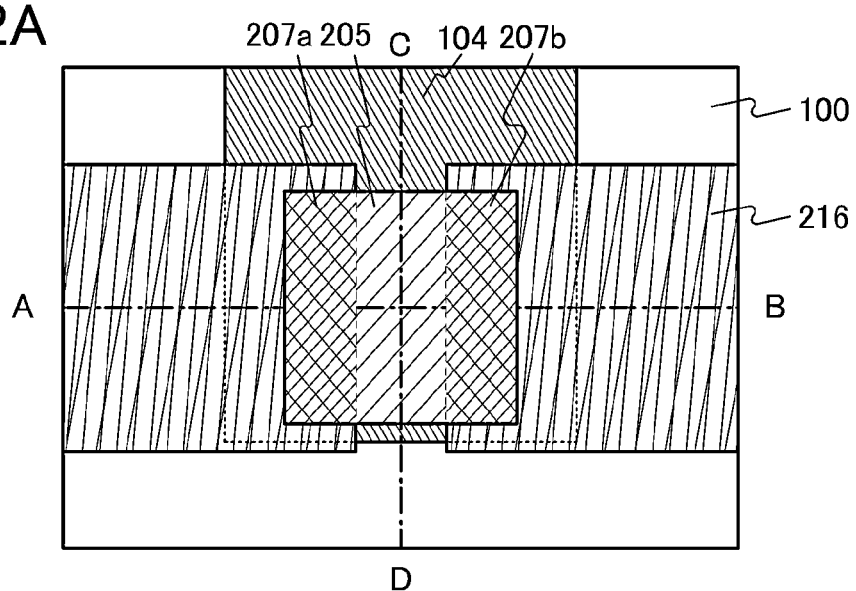
FIGS. 2A to 2C are a top view and cross-sectional views illustrating an example of a transistor according to one embodiment of the present invention.
Figure 2B:
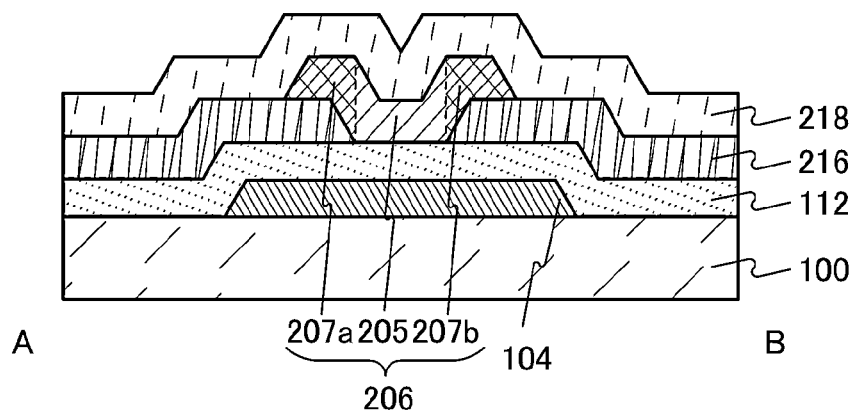
Figure 2C:
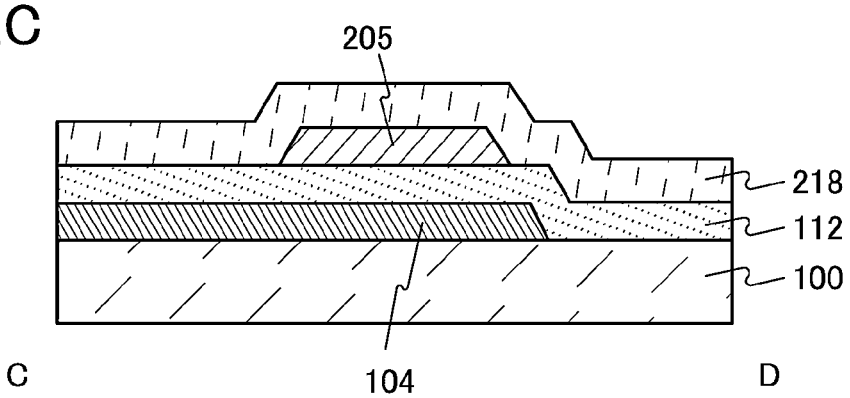

FIGS. 2A to 2C are a top view and cross-sectional views of the transistor. A cross section along dashed-dotted line A-B in FIG. 2A and a cross section along dashed-dotted line C-D in FIG. 2A correspond to a cross section A-B in FIG. 2B and a cross section C-D in FIG. 2C, respectively.

The cross section A-B in FIG. 2B is described in detail below.

The transistor includes a substrate 100, a gate electrode 104 over the substrate 100, a gate insulating film 112 covering the gate electrode 104, a pair of electrodes 216 over the gate insulating film 112, and an oxide semiconductor film 206 including a channel region 205, a source region 207a, and a drain region 207b, which is over the gate electrode 104 with the gate insulating film 112 provided therebetween and partly in contact with the pair of electrodes 216. Note that an interlayer insulating film 218 over the gate insulating film 112, the pair of electrodes 216, and the oxide semiconductor film 206 is preferably provided, so that the oxide semiconductor film 206 is not exposed. Here, the pair of electrodes 216, the oxide semiconductor film 206, and the interlayer insulating film 218 may be referred to the pair of electrodes 116, the oxide semiconductor film 106, and the interlayer insulating film 118 described in Embodiment 2, respectively.

The source region 207a and the drain region 207b are referred to the source region 107a and the drain region 107b described in Embodiment 2. That is, by adding at least one of a nitrogen ion having a concentration higher than or equal to $1\times10^{19}$ cm$^{-3}$ and lower than or equal to $1\times10^{22}$ cm$^{-3}$, a hydrogen ion having a concentration higher than or equal to $1\times10^{20}$ cm$^{-3}$ and lower than or equal to $3\times10^{22}$ cm$^{-3}$, and an oxygen ion having a concentration higher than or equal to $1\times10^{20}$ cm$^{-3}$ and lower than or equal to $3\times10^{22}$ cm$^{-3}$ to a part of the oxide semiconductor film 206, a microvoid is provided in the oxide semiconductor film 206, and by capturing hydrogen in the microvoid, the source region 207a and the drain region 207b are formed. Further, hydrogen is removed from the region of the oxide semiconductor film 206 other than the source region 207a and the drain region 207b, so that the channel region 205 which is high purified can be formed.

In FIGS. 2A to 2C, the gate electrode 104 is larger than the oxide semiconductor film 206 in length and width, so that degradation and generation of electric charge due to light are suppressed in the oxide semiconductor film 206; however, the present invention is not limited to this structure. For example, the oxide semiconductor film 206 may be larger than the gate electrode 104 in length and width in the top view.

Next, a method for manufacturing the transistor illustrated in FIGS. 2A to 2C is described with reference to FIGS. 15A to 15D.

First, a conductive film is formed over the substrate 100 by a sputtering method, an evaporation method, or the like, and is processed to form the gate electrode 104. Then, the gate insulating film 112 covering the gate electrode 104 is formed. Next, a conductive film is formed over the gate insulating film 112 by a sputtering method, an evaporation method, or the like, and is processed to form the pair of electrodes 216 (see FIG. 15A).

Figure 15A:
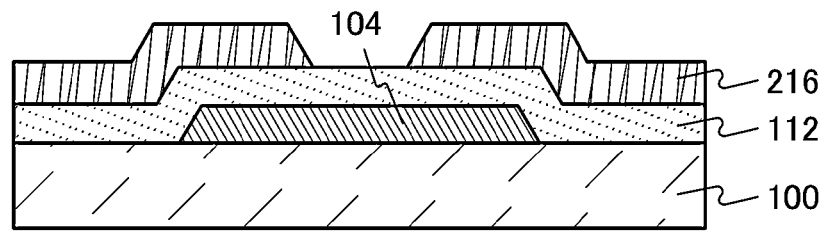
FIGS. 15A to 15D are cross-sectional views each illustrating an example of a manufacturing method of a transistor according to one embodiment of the present invention.
Figure 15B:
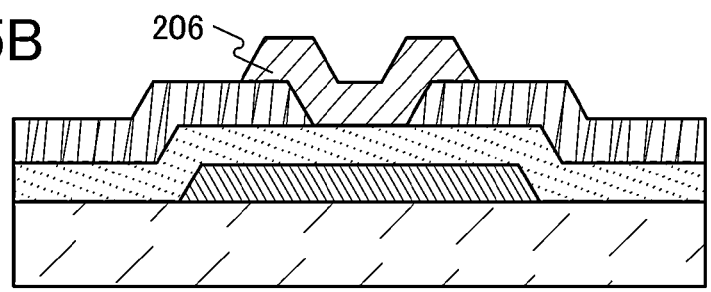
Figure 15C:
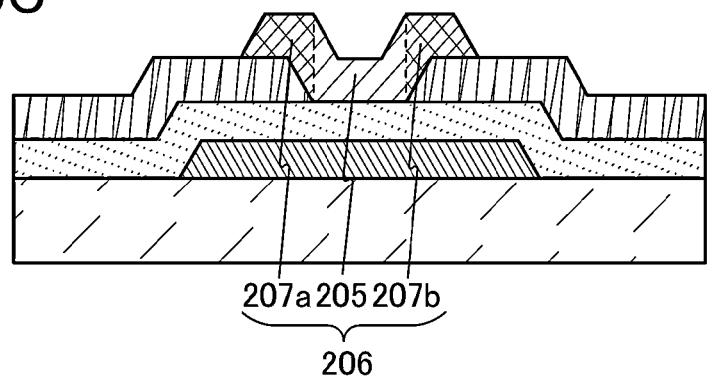

Next, an oxide semiconductor film is formed over the gate electrode 104 with the gate insulating film 112 provided therebetween, and is processed to form the oxide semiconductor film 206 which is partly in contact with the pair of electrodes 216 (see FIG. 15B).

Then, a resist mask or the like is formed over the oxide semiconductor film 206, and at least one of a nitrogen ion having a concentration higher than or equal to $1\times10^{19}$ cm$^{-3}$ and lower than or equal to $1\times10^{22}$ cm$^{-3}$, a hydrogen ion having a concentration higher than or equal to $1\times10^{20}$ cm$^{-3}$ and lower than or equal to $3\times10^{22}$ cm$^{-3}$, and an oxygen ion having a concentration higher than or equal to $1\times10^{20}$ cm$^{-3}$ and lower than or equal to $3\times10^{22}$ cm$^{-3}$ is added to a part of the oxide semiconductor film 206. By the addition, a microvoid can be formed in the part of the oxide semiconductor film 206. Then, heat treatment at a temperature higher than or equal to 200° C. and lower than or equal to 700° C., preferably higher than or equal to 300° C. and lower than equal to 650° C. is performed thereon, thereby hydrogen can be captured in the microvoid. In this manner, the channel region 205, the source region 207a, and the drain region 207b are formed (see FIG. 15C).

Figure 15D:
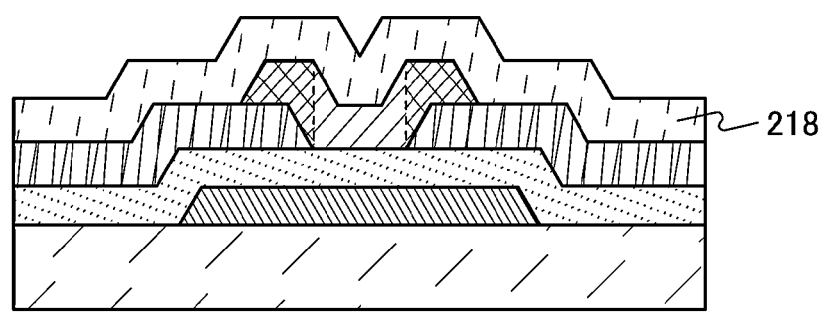

Moreover, the interlayer insulating film 218 can be formed over the oxide semiconductor film 206 and the pair of electrodes 216 (see FIG. 15D).

Through the above-described process, the transistor illustrated in FIGS. 2A to 2C can be manufactured.

This embodiment can be implemented in appropriate combination with the other embodiments.

Embodiment 4

In this embodiment, a transistor having a structure which is different from the structures of the transistors described in Embodiments 2 and 3 is described.

Figure 3A:
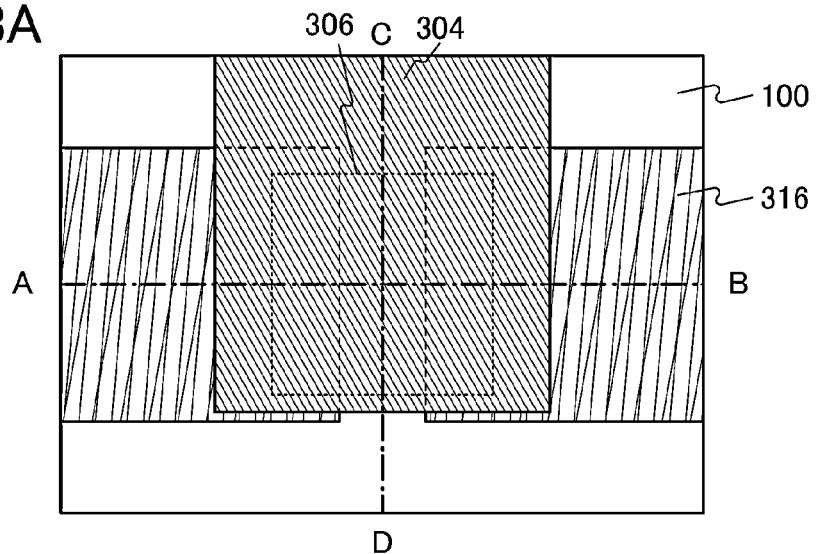
FIGS. 3A to 3C are a top view and cross-sectional views illustrating an example of a transistor according to one embodiment of the present invention.
Figure 3B:
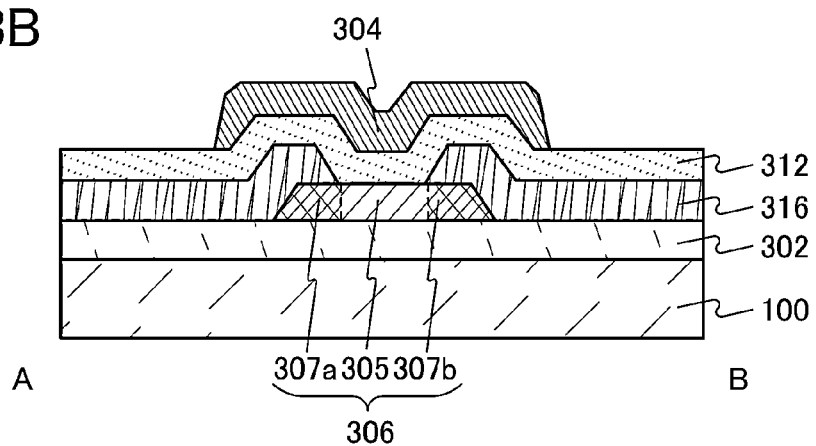
Figure 3C:
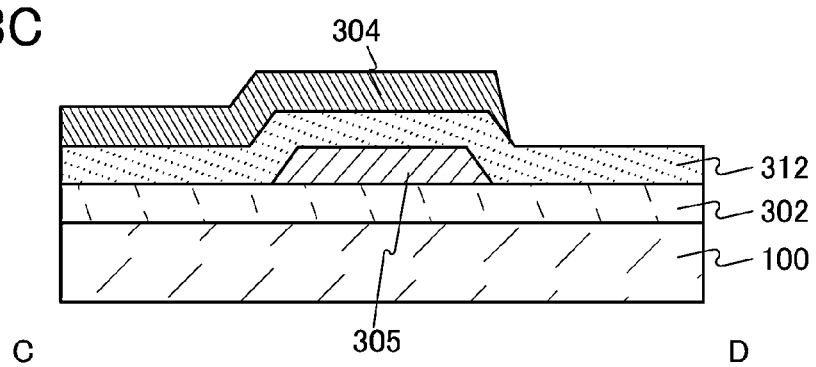

FIGS. 3A to 3C are a top view and cross-sectional views of a transistor. A cross section along dashed-dotted line A-B in FIG. 3A and a cross section along dashed-dotted line C-D in FIG. 3A correspond to a cross section A-B in FIG. 3B and a cross section C-D in FIG. 3C, respectively.

The cross section A-B in FIG. 3B is described in detail below.

The transistor includes a substrate 100, a base insulating film 302 over the substrate 100, an oxide semiconductor film 306 including a channel region 305, a source region 307a, and a drain region 307b over the base insulating film 302, a pair of electrodes 316 which is over the oxide semiconductor film 306 and partly in contact with the oxide semiconductor film 306, a gate insulating film 312 over the oxide semiconductor film 306 and the pair of electrodes 316, and a gate electrode 304 over the oxide semiconductor film 306 with the gate insulating film 312 provided therebetween. Note that the base insulating film 302 is not necessarily provided, which depends on the surface condition of the substrate 100. Here, the pair of electrodes 316, the oxide semiconductor film 306, the gate electrode 304, and the gate insulating film 312 may be referred to the pair of electrodes 116, the oxide semiconductor film 106, the gate electrode 104, and the gate insulating film 112 described in Embodiment 2, respectively.

The source region 307a and the drain region 307b are referred to the source region 107a and the drain region 107b described in Embodiment 2. That is, by adding at least one of a nitrogen ion having a concentration higher than or equal to $1\times10^{19}$ cm$^{-3}$ and lower than or equal to $1\times10^{22}$ cm$^{-3}$, a hydrogen ion having a concentration higher than or equal to $1\times10^{20}$ cm$^{-3}$ and lower than or equal to $3\times10^{22}$ cm$^{-3}$, and an oxygen ion having a concentration higher than or equal to $1\times10^{20}$ cm$^{-3}$ and lower than or equal to $3\times10^{22}$ cm$^{-3}$ to a part of the oxide semiconductor film 306, a microvoid is provided in the oxide semiconductor film 306, and by capturing hydrogen in the microvoid, the source region 307a and the drain region 307b are formed. Further, hydrogen is removed from the region of the oxide semiconductor film 306 other than the source region 307a and the drain region 307b, so that the channel region 305 which is high purified can be formed.

Further, the base insulating film 302 can have the same structure as the gate insulating film 312.

In FIGS. 3A to 3C, the gate electrode 304 is larger than the oxide semiconductor film 306 in length and width, so that degradation and generation of electric charge due to light are suppressed in the oxide semiconductor film 306; however, the present invention is not limited to this structure. For example, the oxide semiconductor film 306 may be larger than the gate electrode 304 in length and width in the top view.

Next, a method for manufacturing the transistor illustrated in FIGS. 3A to 3C is described with reference to FIGS. 16A to 16D.

First, the base insulating film 302 is formed over the substrate 100. Next, an oxide semiconductor film is formed over the base insulating film 302, and is processed to form the oxide semiconductor film 306 (see FIG. 16A). Note that the base insulating film 302 is not necessarily provided, which depends on the surface condition of the substrate 100.

Then, a resist mask or the like is formed over the oxide semiconductor film 306, and at least one of a nitrogen ion having a concentration higher than or equal to $1\times10^{19}$ cm$^{-3}$ and lower than or equal to $1\times10^{22}$ cm$^{-3}$, a hydrogen ion having a concentration higher than or equal to $1\times10^{20}$ cm$^{-3}$ and lower than or equal to $3\times10^{22}$ cm$^{-3}$, and an oxygen ion having a concentration higher than or equal to $1\times10^{20}$ cm$^{-3}$ and lower than or equal to $3\times10^{22}$ cm$^{-3}$ is added to a part of the oxide semiconductor film 306. By the addition, a microvoid can be formed in the part of the oxide semiconductor film 306. Then, heat treatment at a temperature higher than or equal to 200° C. and lower than or equal to 700° C., preferably higher than or equal to 300° C. and lower than or equal to 650° C. is performed thereon, thereby hydrogen can be captured in the microvoid. In this manner, the channel region 305, the source region 307a, and the drain region 307b are formed (see FIG. 16B).

Figure 16A:
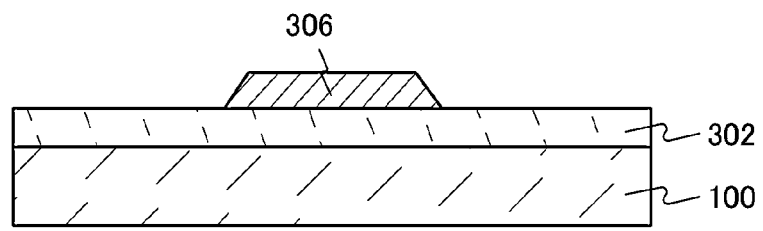
FIGS. 16A to 16D are cross-sectional views each illustrating an example of a manufacturing method of a transistor according to one embodiment of the present invention.
Figure 16B:
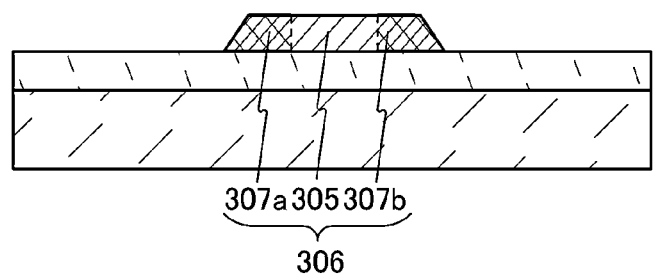
Figure 16C:
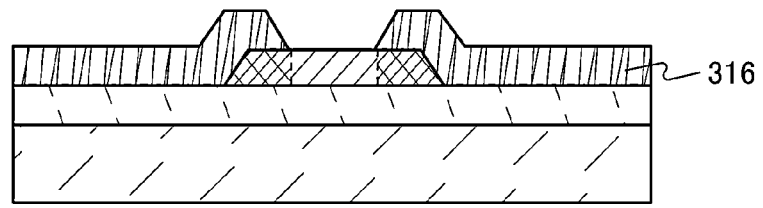
Figure 16D:
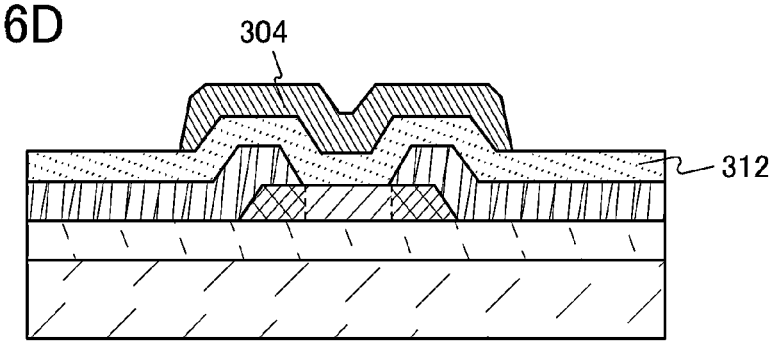

Next, a conductive film is formed over the oxide semiconductor film 306 by a sputtering method, an evaporation method, or the like, and is processed to form the pair of electrodes 316 which is partly in contact with the oxide semiconductor film 306 (see FIG. 16C).

Then, a gate insulating film 312 is formed over the oxide semiconductor film 306 and the pair of electrodes 316. Next, a conductive film is formed by a sputtering method, an evaporation method, or the like, and is processed to form the gate electrode 304 overlapping with the oxide semiconductor film 306 with the gate insulating film 312 interposed therebetween (see FIG. 16D).

Through the above-described process, the transistor illustrated in FIGS. 3A to 3C can be manufactured.

This embodiment can be implemented in appropriate combination with the other embodiments.

Embodiment 5

In this embodiment, a transistor having a structure partly different from that of the transistor described in Embodiments 4 is described.

Figure 4A:
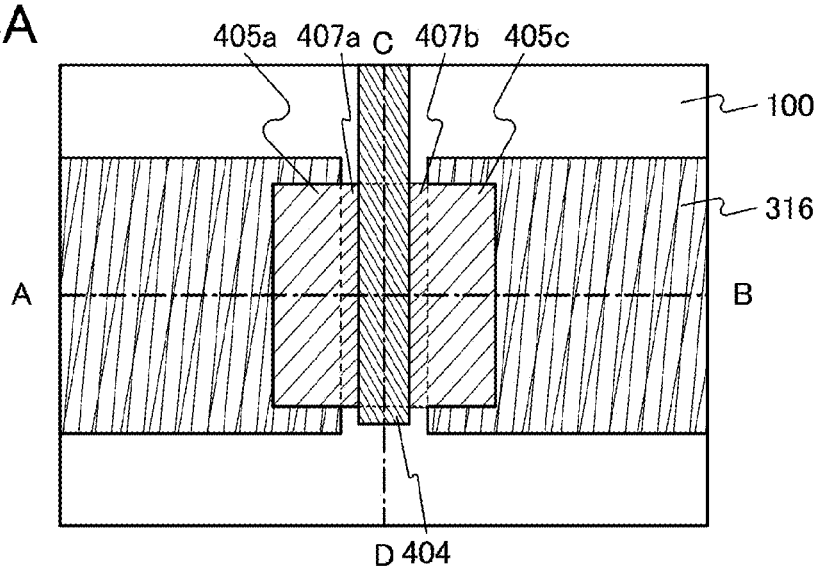
FIGS. 4A to 4C are a top view and cross-sectional views illustrating an example of a transistor according to one embodiment of the present invention.
Figure 4B:
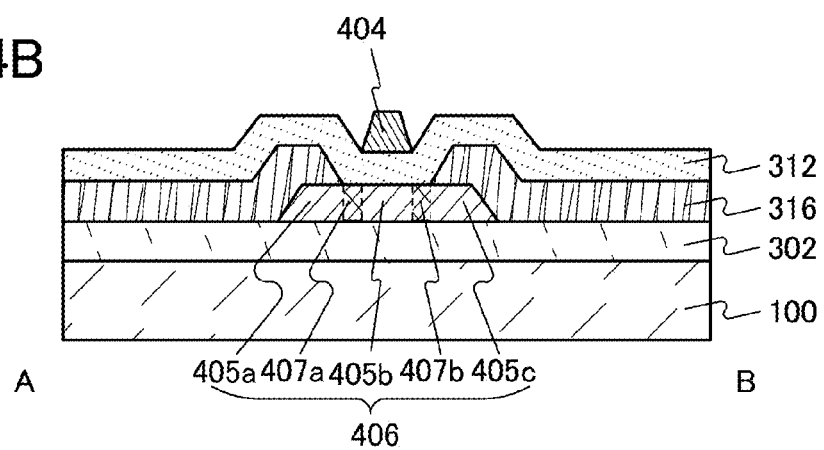
Figure 4C:
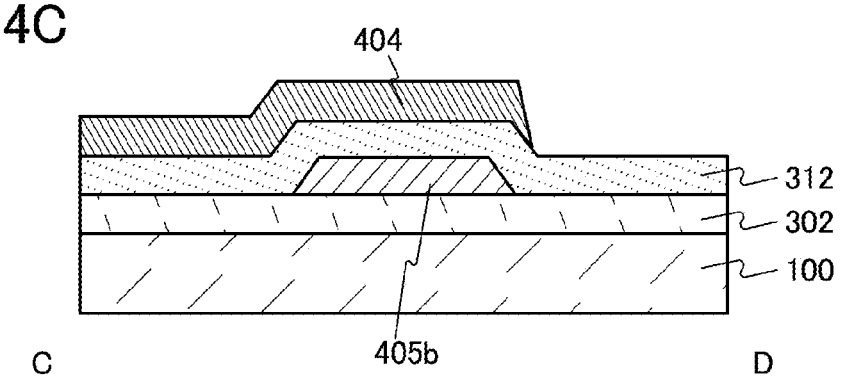

FIGS. 4A to 4C are a top view and cross-sectional views of a transistor. A cross section along dashed-dotted line A-B in FIG. 4A and a cross section along dashed-dotted line C-D in FIG. 4A correspond to a cross section A-B in FIG. 4B and a cross section C-D in FIG. 4C, respectively.

The cross section A-B in FIG. 4B is described in detail below.

The transistor includes a substrate 100, a base insulating film 302 over the substrate 100, an oxide semiconductor film 406 including a region 405a, a region 405b, a region 405c, a region 407a, and a region 407b over the base insulating film 302, a pair of electrodes 316 which is over the oxide semiconductor film 406 and partly in contact with the oxide semiconductor film 406, a gate insulating film 312 over the oxide semiconductor film 406 and the pair of electrodes 316, and a gate electrode 404 which is not overlapped with the pair of electrodes 316 and is over the oxide semiconductor film 406 with the gate insulating film 312 provided therebetween. Note that the base insulating film 302 is not necessarily provided, which depends on a surface condition of the substrate 100. The oxide semiconductor film 406 and the gate electrode 404 are referred to the oxide semiconductor film 106 and the gate electrode 104 described in Embodiment 2.

The region 407a and the region 407b each have a sheet resistance value higher than or equal to that each of the source region 107a and the drain region 107b described in Embodiment 2 and lower than or equal to that each of the region 405a, the region 405b, and the region 405c. By adding at least one of a nitrogen ion having a concentration higher than or equal to $1\times10^{19}$ cm$^{-3}$ and lower than or equal to $1\times10^{22}$ cm$^{-3}$, a hydrogen ion having a concentration higher than or equal to $1\times10^{20}$ cm$^{-3}$ and lower than or equal to $3\times10^{22}$ cm$^{-3}$, and an oxygen ion having a concentration higher than or equal to $1\times10^{20}$ cm$^{-3}$ and lower than or equal to $3\times10^{22}$ cm$^{-3}$ to a part of the oxide semiconductor film 406, a microvoid is provided in the oxide semiconductor film 406, and by capturing hydrogen in the microvoid, the region 407a and the region 407b are formed. Further, hydrogen is removed from the region of the oxide semiconductor film 406 other than the region 407a and the region 407b (the region 405a, the region 405b, and the region 405c), so that the channel region which is high purified can be formed.

The resistance of the region 407a and the region 407b is higher than that of the source region 107a and the drain region 107b described in Embodiment 2, and lower than any concentration of the region 405a, the region 405b, and the region 405c, thereby deterioration caused by hot carriers or the like can be suppressed even when the transistor is miniaturized, and a short-channel effect can be reduced.

Next, a method for manufacturing the transistor illustrated in FIGS. 4A to 4C is described with reference to FIGS. 17A to 17D.

First, the base insulating film 302 is formed over the substrate 100. Next, an oxide semiconductor film is formed over the base insulating film 302 and is processed to form the oxide semiconductor film 406 (see FIG. 17A). Note that the base insulating film 302 is not necessarily provided, which depends on the surface condition of the substrate 100.

Figure 17A:
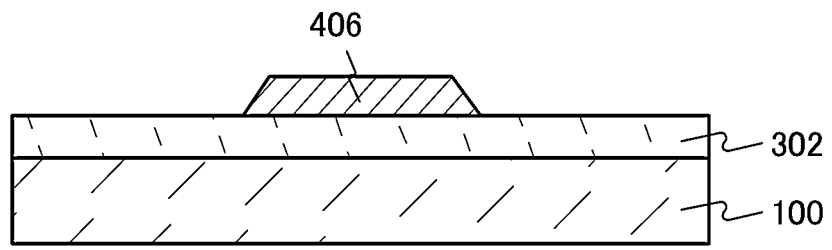
FIGS. 17A to 17D are cross-sectional views each illustrating an example of a manufacturing method of a transistor according to one embodiment of the present invention.
Figure 17B:
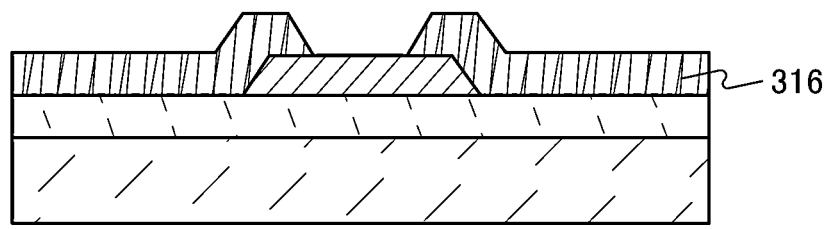
Figure 17C:
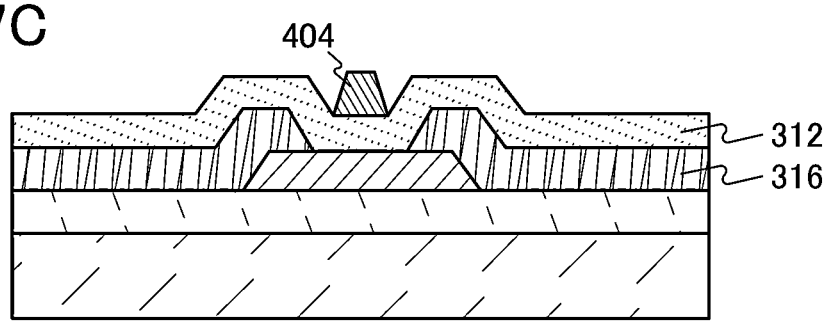
Figure 17D:
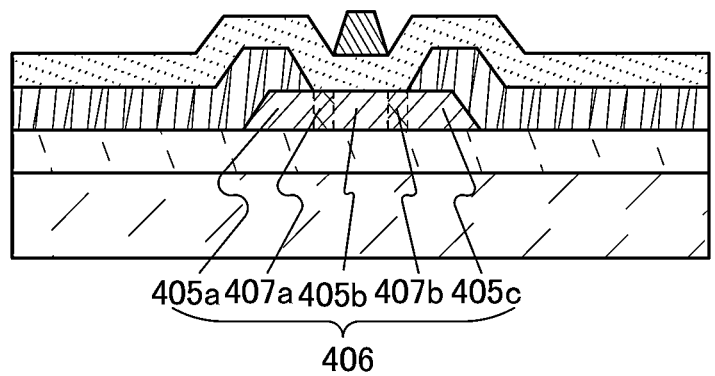

Next, a conductive film is formed over the oxide semiconductor film 406 by a sputtering method, an evaporation method, or the like, and is processed to form the pair of electrodes 316 (see FIG. 17B).

Then, a gate insulating film 312 is formed over the oxide semiconductor film 406 and the pair of electrodes 316. Next, a conductive film is formed thereon by a sputtering method, an evaporation method, or the like, and is processed to form a gate electrode 404 which overlaps with the oxide semiconductor film 406 with the gate insulating film 312 provided therebetween and does not overlap with the pair of electrodes 316 (see FIG. 17C).

Then, with the use of the gate electrode 404 and the pair of the electrodes 316 as a mask, at least one of a nitrogen ion having a concentration higher than or equal to $1\times10^{19}$ cm$^{-3}$ and lower than or equal to $1\times10^{22}$ cm$^{-3}$, a hydrogen ion having a concentration higher than or equal to $1\times10^{20}$ cm$^{-3}$ and lower than or equal to $3\times10^{22}$ cm$^{-3}$, and an oxygen ion having a concentration higher than or equal to $1\times10^{20}$ cm$^{-3}$ and lower than or equal to $3\times10^{22}$ cm$^{-3}$ is added to a part of the oxide semiconductor film 406. By the addition, a microvoid can be formed in the part of the oxide semiconductor film 406. Then, heat treatment at a temperature higher than or equal to 200° C. and lower than or equal to 700° C., preferably at a temperature higher than or equal to 300° C. and lower than or equal to 650° C. is performed thereon, thereby hydrogen can be captured in the microvoid. In this manner, the region 405a, the region 405b, the region 405c, the region 407a, and the region 407b are formed (see FIG. 17D).

Through the above-described process, the transistor illustrated in FIGS. 4A to 4C can be manufactured.

This embodiment can be implemented in appropriate combination with the other embodiments.

Embodiment 6

In this embodiment, a transistor having a structure different from that of the transistor described in Embodiments 2 to 5 is described.

Figure 5A:
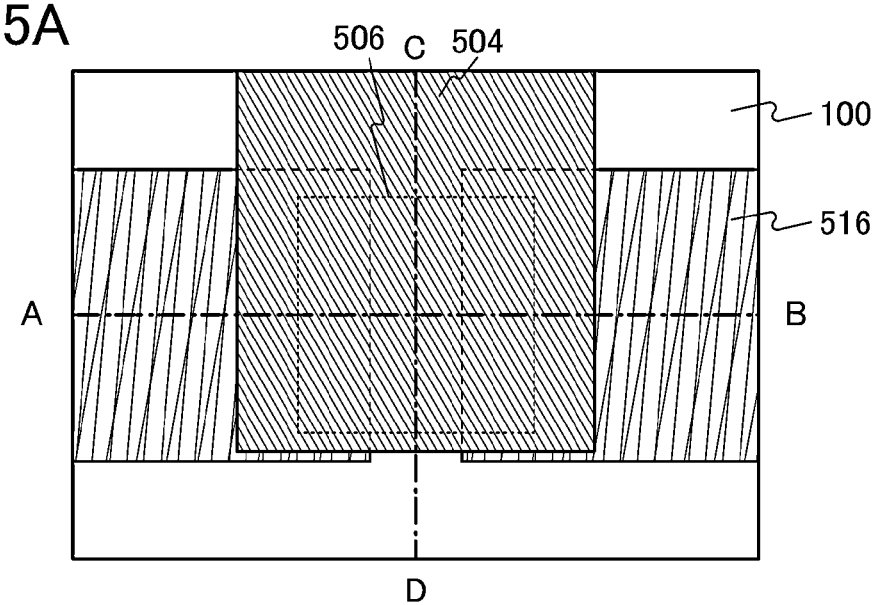
FIGS. 5A to 5C are a top view and cross-sectional views illustrating an example of a transistor according to one embodiment of the present invention.
Figure 5B:
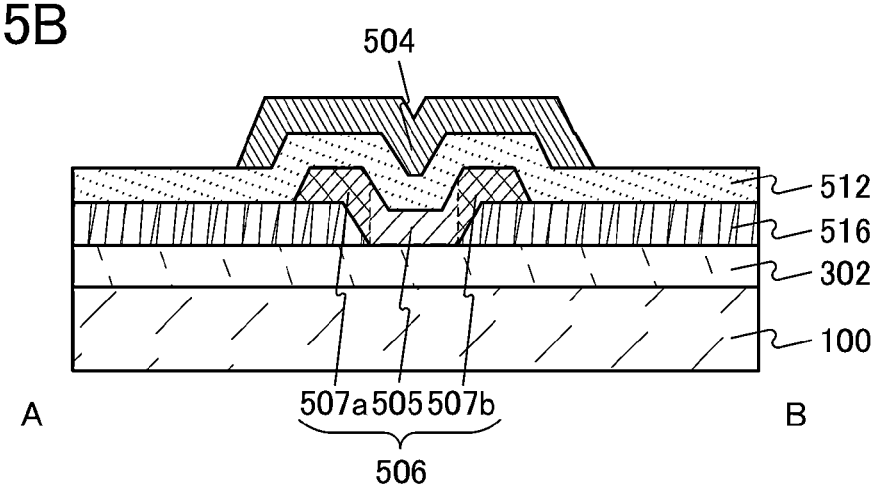
Figure 5C:
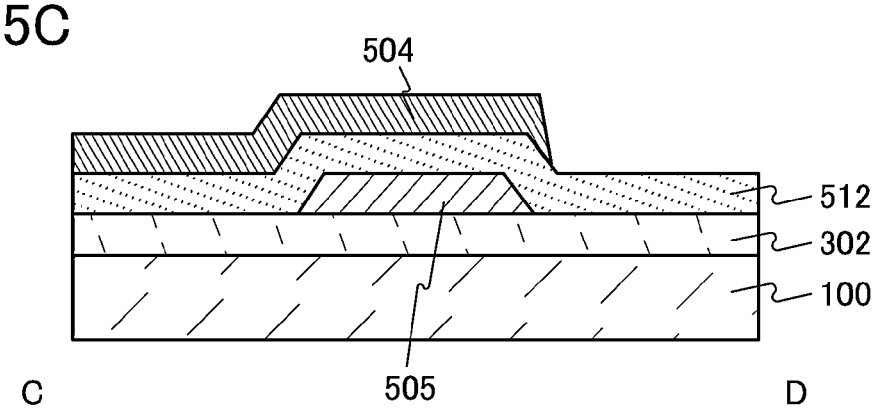

FIGS. 5A to 5C are a top view and cross-sectional views of a transistor. A cross section along dashed-dotted line A-B in FIG. 5A and a cross section along dashed-dotted line C-D in FIG. 5A correspond to a cross section A-B in FIG. 5B and a cross section C-D in FIG. 5C, respectively.

The cross section A-B in FIG. 5B is described in detail below.

The transistor includes a substrate 100, a base insulating film 302 over the substrate 100, a pair of electrodes 516 over the base insulating film 302, an oxide semiconductor film 506 including a channel region 505, a source region 507a, and a drain region 507b, which is over the pair of electrodes 516 and partly in contact with the pair of electrodes 516, a gate insulating film 512 over the oxide semiconductor film 506 and the pair of electrodes 516, and a gate electrode 504 over the oxide semiconductor film 506 with the gate insulating film 512 provided therebetween. Note that the base insulating film 302 is not necessarily provided, which depends on a surface condition of the substrate 100. Here, the pair of electrodes 516, the oxide semiconductor film 506, the gate electrode 504, and the gate insulating film 512 may be referred to the pair of electrodes 116, the oxide semiconductor film 106, the gate electrode 104, and the gate insulating film 112 described in Embodiment 2, respectively.

Here, the source region 507a and the drain region 507b are referred to the source region 107a and the drain region 107b described in Embodiment 2. That is, by adding at least one of a nitrogen ion having a concentration higher than or equal to $1\times10^{19}$ cm$^{-3}$ and lower than or equal to $1\times10^{22}$ cm$^{-3}$, a hydrogen ion having a concentration higher than or equal to $1\times10^{20}$ cm$^{-3}$ and lower than or equal to $3\times10^{22}$ cm$^{-3}$, and an oxygen ion having a concentration higher than or equal to $1\times10^{20}$ cm$^{-3}$ and lower than or equal to $3\times10^{22}$ cm$^{-3}$ to a part of the oxide semiconductor film 506, a microvoid is provided in the oxide semiconductor film 506, and by capturing hydrogen in the microvoid, the source region 507a and the drain region 507b are formed. Further, hydrogen is removed from the region of the oxide semiconductor film 506 other than the source region 507a and the drain region 507b, so that the channel region 505 which is high purified can be formed.

In FIGS. 5A to 5C, the gate electrode 504 is larger than the oxide semiconductor film 506 in length and width, so that degradation and generation of electric charge due to light are suppressed in the oxide semiconductor film 506; however, the present invention is not limited to this structure. For example, the oxide semiconductor film 506 may be larger than the gate electrode 504 in length and width in the top view.

Next, a method for manufacturing the transistor illustrated in FIGS. 5A to 5C is described with reference to FIGS. 18A to 18D.

First, the base insulating film 302 is formed over the substrate 100. Next, a conductive film is formed over the base insulating film 302 by a sputtering method, an evaporation method, or the like, and is processed to form the pair of electrodes 516 (see FIG. 18A). Note that the base insulating film 302 is not necessarily provided, which depends on a surface condition of the substrate 100.

Figure 18A:
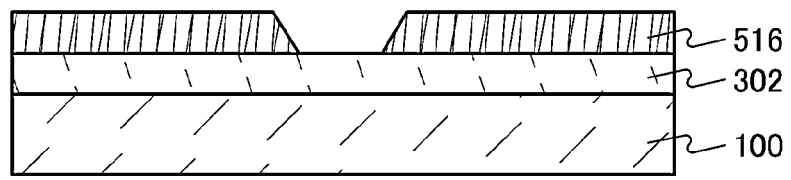
FIGS. 18A to 18D are cross-sectional views each illustrating an example of a manufacturing method of a transistor according to one embodiment of the present invention.
Figure 18B:
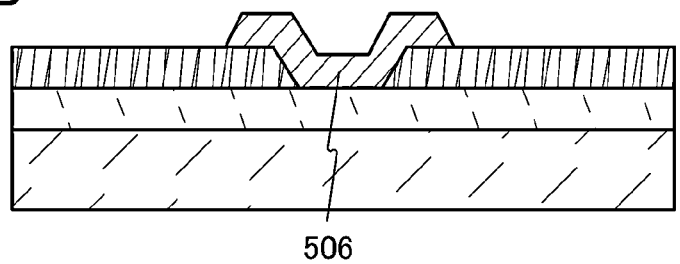
Figure 18C:
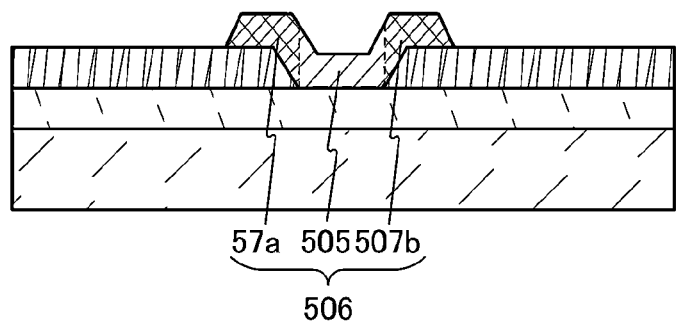
Figure 18D:
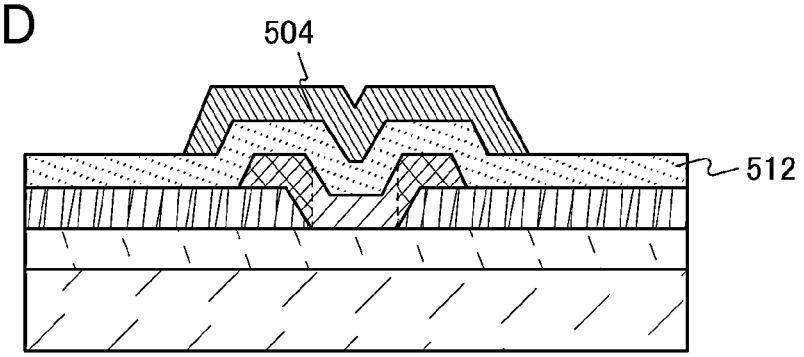
Figure 19A:
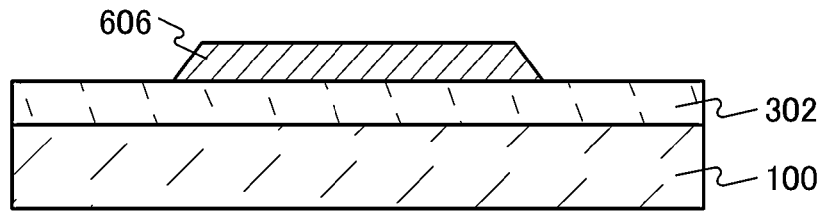
FIGS. 19A to 19D are cross-sectional views each illustrating an example of a manufacturing method of a transistor according to one embodiment of the present invention.
Figure 19B:
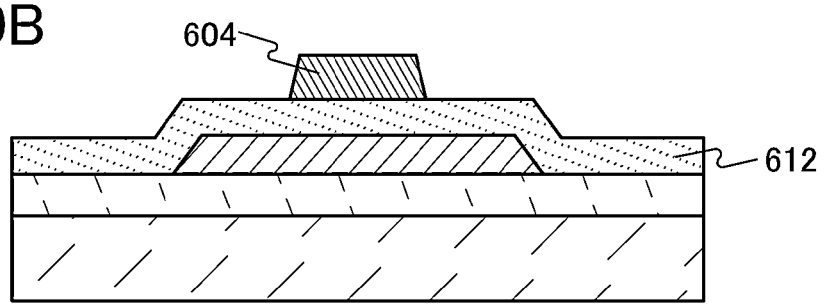
Figure 19C:
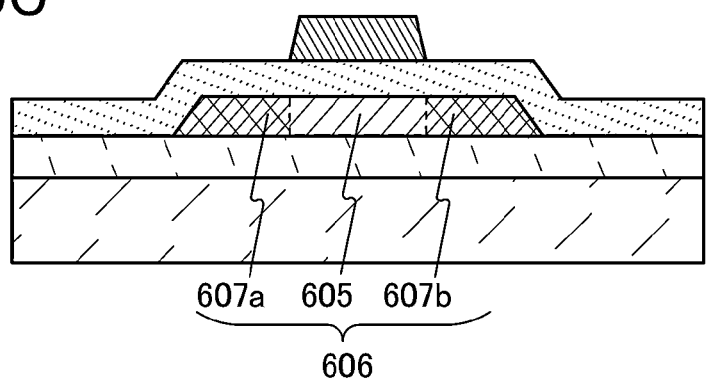
Figure 19D:
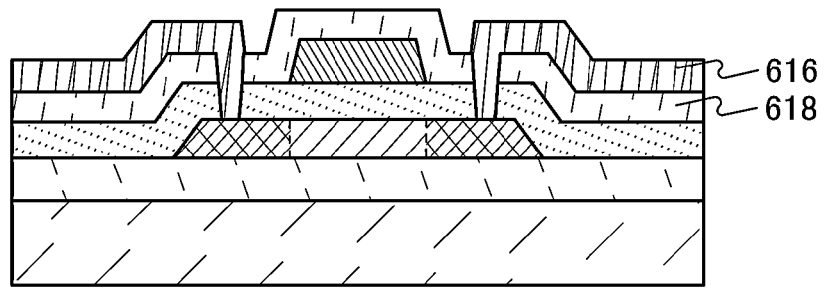

Next, an oxide semiconductor film is formed, and is processed to form the oxide semiconductor film 506, which is partly in contact with the pair of electrodes 516 (see FIG. 18B).

Then, a resist mask or the like is formed over the oxide semiconductor film 506, and at least one of a nitrogen ion having a concentration higher than or equal to $1\times10^{19}$ cm$^{-3}$ and lower than or equal to $1\times10^{22}$ cm$^{-3}$, a hydrogen ion having a concentration higher than or equal to $1\times10^{20}$ cm$^{-3}$ and lower than or equal to $3\times10^{22}$ cm$^{-3}$, and an oxygen ion having a concentration higher than or equal to $1\times10^{20}$ cm$^{-3}$ and lower than or equal to $3\times10^{22}$ cm$^{-3}$ is added to a part of the oxide semiconductor film 506. By the addition, a microvoid can be formed in the part of the oxide semiconductor film 506. Then, heat treatment at a temperature higher than or equal to 200° C. and lower than or equal to 700° C., preferably at a temperature higher than or equal to 300° C. and lower than or equal to 650° C. is performed thereon, thereby hydrogen can be captured in the microvoid. In this manner, the channel region 505, the source region 507a, and the drain region 507b are formed (see FIG. 18C).

Then, a gate insulating film 512 is formed over the oxide semiconductor film 506 and the pair of electrodes 516. Next, a conductive film is formed thereon by a sputtering method, an evaporation method, or the like, and is processed to form the gate electrode 504 overlapping with the oxide semiconductor film 506 with the gate insulating film 512 provided therebetween (see FIG. 18D).

Through the above-described process, the transistor illustrated in FIGS. 5A to 5C can be manufactured.

This embodiment can be implemented in appropriate combination with the other embodiments.

Embodiment 7

In this embodiment, a transistor having a structure different from that of the transistor described in Embodiments 2 to 6 is described.

FIGS. 6A to 6C are a top view and cross-sectional views of a transistor included in a semiconductor device in one embodiment of the present invention. A cross section along dashed-dotted line A-B in FIG. 6A and a cross section along dashed-dotted line C-D in FIG. 6A correspond to a cross section A-B in FIG. 6B and a cross section C-D in FIG. 6C, respectively.

The cross section A-B in FIG. 6B is described in detail below.

The transistor includes a substrate 100, a base insulating film 302 over the substrate 100, an oxide semiconductor film 606 including a channel region 605, a source region 607a, and a drain region 607b over the base insulating film 302, a gate insulating film 612 over the oxide semiconductor film 606, a gate electrode 604 overlapping with the channel region 605 with the gate insulating film 612 interposed therebetween, an interlayer insulating film 618 over the oxide semiconductor film 606 and the gate electrode 604, and a pair of electrodes 616 which is in contact with the oxide semiconductor film 606 through opening portions formed in the gate insulating film 612 and the interlayer insulating film 618. Note that the base insulating film 302 is not necessarily provided, which depends on a surface condition of the substrate 100. Here, the pair of electrodes 616, the oxide semiconductor film 606, the gate electrode 604, the interlayer insulating film 618, and the gate insulating film 612 may be referred to the pair of electrodes 116, the oxide semiconductor film 106, the gate electrode 104, the interlayer insulating film 118, and the gate insulating film 112 described in Embodiment 2, respectively.

Although not illustrated, the gate insulating film 612 and the gate electrode 604 may have substantially the same shape seen from the top surface. The shape can be obtained by processing the gate electrode 604 and the gate insulating film 612 together with use of one mask. Alternatively, the shape can be obtained by processing the gate insulating film 612 with use of the gate electrode 604 as a mask.

In FIGS. 6A to 6C, although the shape of the opening portion provided in the gate insulating film 612 and the interlayer insulating film 618 has a circular shape when seen from the above, the present invention is not limited thereto. There is no particular limitation on the shape of the opening portions, as long as the opening portions expose the source region 607a and the drain region 607b.

The channel region 605 and the gate electrode 604 may have substantially the same shape when seen from the above. This shape is obtained by forming the source region 607a and the drain region 607b of the oxide semiconductor film 606 with the use of the gate insulating film 612 or the gate electrode 604 as a mask. Here, the gate electrode 604 is used as the mask, and at least one of a nitrogen ion having a concentration higher than or equal to $1\times10^{19}$ cm$^{-3}$ and lower than or equal to $1\times10^{22}$ cm$^{-3}$, a hydrogen ion having a concentration higher than or equal to $1\times10^{20}$ cm$^{-3}$ and lower than or equal to $3\times10^{22}$ cm$^{-3}$, and an oxygen ion having a concentration higher than or equal to $1\times10^{20}$ cm$^{-3}$ and lower than or equal to $3\times10^{22}$ cm$^{-3}$ is added to a part of the oxide semiconductor film 406, whereby the oxide semiconductor film 606 is provided with a microvoid, and hydrogen is captured in the microvoid, so that the source region 607a and the drain region 607b are formed. At the same time, hydrogen is removed from the region of the oxide semiconductor film 606 other than the source region 607a and the drain region 607b, so that the channel region 605 which is high purified can be formed.

Next, a method for manufacturing the transistor illustrated in FIGS. 6A to 6C is described with reference to FIGS. 19A to 19D.

First, the base insulating film 302 is formed over the substrate 100. Next, an oxide semiconductor film is formed over the base insulating film 302, and is processed to form the oxide semiconductor film 606 (see FIG. 19A). Note that the base insulating film 302 is not necessarily provided, which depends on a surface condition of the substrate 100.

Next, the gate insulating film 612 is formed by a sputtering method, a plasma CVD method, or the like. Then, a conductive film is formed by a sputtering method, an evaporation method, or the like. A resist mask or the like is formed over the conductive film, and the conductive film is processed, thereby the gate electrode 604 is formed (see FIG. 19B). Note that after formation of the gate electrode 604, the width of the gate electrode 604 may be narrowed by performing plasma treatment or chemical treatment.

Then, with the use of the gate electrode 604 as a mask, at least one of a nitrogen ion having a concentration higher than or equal to $1\times10^{19}$ cm$^{-3}$ and lower than or equal to $1\times10^{22}$ cm$^{-3}$, a hydrogen ion having a concentration higher than or equal to $1\times10^{20}$ cm$^{-3}$ and lower than or equal to $3\times10^{22}$ cm$^{-3}$, and an oxygen ion having a concentration higher than or equal to $1\times10^{20}$ cm$^{-3}$ and lower than or equal to $3\times10^{22}$ cm$^{-3}$ is added to a part of the oxide semiconductor film 606. By the addition, a microvoid can be formed in the part of the oxide semiconductor film 606. Then, heat treatment at a temperature higher than or equal to 200° C. and lower than or equal to 700° C., preferably at a temperature higher than or equal to 300° C. and lower than or equal to 650° C. is performed thereon, thereby hydrogen can be captured in the microvoid. In this manner, the channel region 605, the source region 607a, and the drain region 607b are formed (see FIG. 19C).

Next, the interlayer insulating film 618 is formed over the oxide semiconductor film 606 and the gate electrode 604, and the opening portions in which the source region 607a and the drain region 607b are exposed is formed in the gate insulating film 612 and the interlayer insulating film 618. Then, a conductive film is formed by a sputtering method, an evaporation method, or the like, and is processed to form the pair of electrodes 616 which is in contact with the oxide semiconductor film 606 (see FIG. 19D).

In FIGS. 19A to 19D, although the shape of the opening portion provided in the gate insulating film 612 and the interlayer insulating film 618 has a circular shape when seen from the above, the present invention is not limited thereto. There is no particular limitation on the shape of the opening portion, as long as the opening portions expose the source region 607a and the drain region 607b.

Through the above-described process, the transistor illustrated in FIGS. 6A to 6C can be manufactured.

This embodiment can be implemented in appropriate combination with the other embodiments.

Embodiment 8

In this embodiment, a transistor having a structure different from that of the transistor described in Embodiments 2 to 7 is described.

Figure 7A:
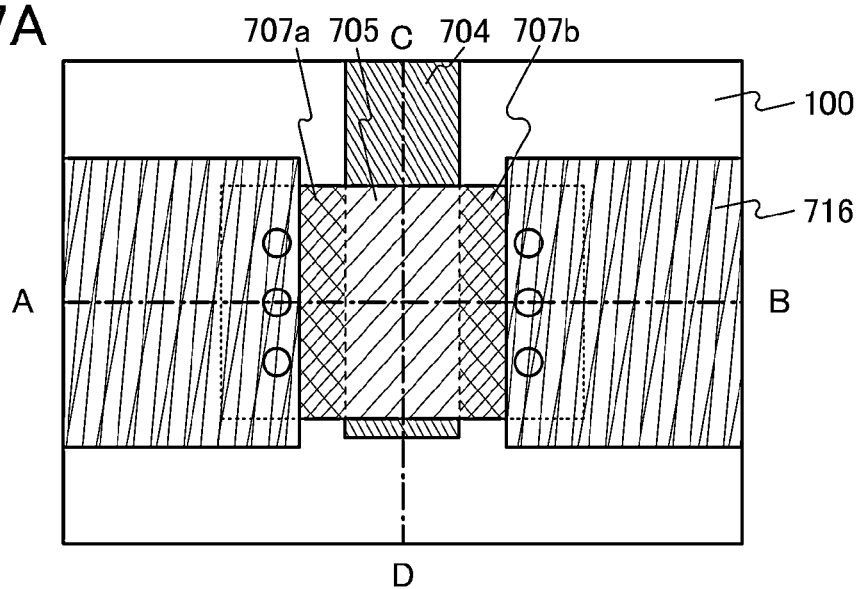
FIGS. 7A to 7C are a top view and cross-sectional views illustrating an example of a transistor according to one embodiment of the present invention.
Figure 7B:
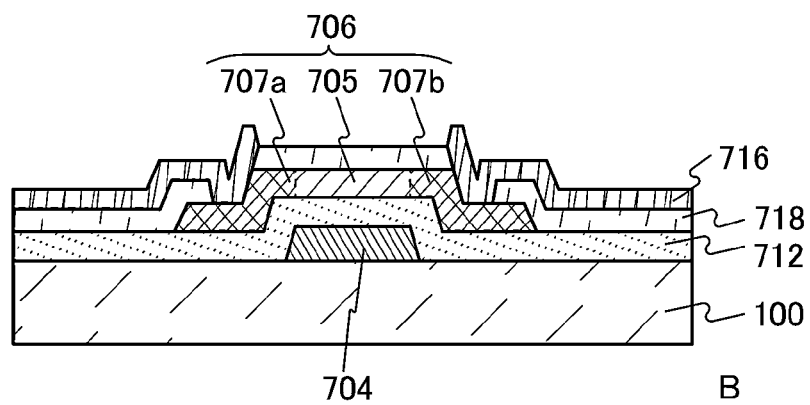
Figure 7C:
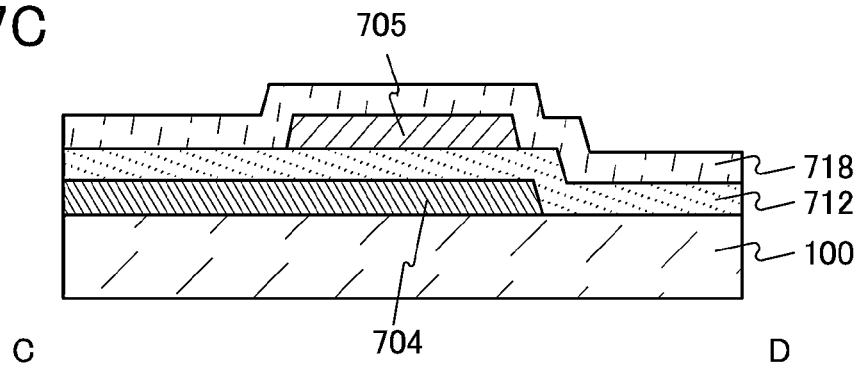

FIGS. 7A to 7C are a top view and cross-sectional views of a transistor. A cross section along dashed-dotted line A-B in FIG. 7A and a cross section along dashed-dotted line C-D in FIG. 7A correspond to a cross section A-B in FIG. 7B and a cross section C-D in FIG. 7C, respectively.

The cross-section A-B of FIG. 7B is described in detail below.

The transistor includes a substrate 100, a gate electrode 704 over the substrate 100, a gate insulating film 712 covering the gate electrode 704, an oxide semiconductor film 706 including a channel region 705, a source region 707a, and a drain region 707b over the gate electrode 704 with the gate insulating film 712 provided therebetween, the interlayer insulating film 718 over the oxide semiconductor film 706 and the gate insulating film 712 including opening portions in which the source region 707a and the drain region 707b are exposed, and a pair of electrodes 716 which is in contact with the oxide semiconductor film 706 through the opening portions provided in the interlayer insulating film 718. Here, the pair of electrodes 716, the oxide semiconductor film 706, the gate electrode 704, the interlayer insulating film 718, and the gate insulating film 712 may be referred to the pair of electrodes 116, the oxide semiconductor film 106, the gate electrode 104, the interlayer insulating film 118, and the gate insulating film 112 described in Embodiment 2, respectively.

In FIGS. 7A to 7C, the gate electrode 704 and the channel region 705 have substantially the same shape when seen from the above; however, the present invention is not limited thereto. The gate electrode 704 and the channel region 705 may have different shapes from each other.

Here, a resist mask or the like is used, and at least one of a nitrogen ion having a concentration higher than or equal to $1\times10^{19}$ cm$^{-3}$ and lower than or equal to $1\times10^{22}$ cm$^{-3}$, a hydrogen ion having a concentration higher than or equal to $1\times10^{20}$ cm$^{-3}$ and lower than or equal to $3\times10^{22}$ cm$^{-3}$, and an oxygen ion having a concentration higher than or equal to $1\times10^{20}$ cm$^{-3}$ and lower than or equal to $3\times10^{22}$ cm$^{-3}$ is added to the oxide semiconductor film 706, whereby the oxide semiconductor film 706 is provided with a microvoid, and hydrogen is captured in the microvoid, so that the source region 707a and the drain region 707b are formed. At the same time, hydrogen is removed from the region of the oxide semiconductor film 706 other than the source region 707a and the drain region 707b, so that the channel region 705 which is high purified can be formed. The resist mask or the like may be formed by a back exposure technique with the use of the gate electrode 704 as a mask. In that case, an area where the source region 707a overlaps with the gate electrode 704 and an area where the drain region 707b overlaps with the gate electrode 704 can be reduced, and thus the parasitic capacitance is reduced, so that the operation speed of the transistor can be increased. In addition, the number of photomasks used for forming a resist mask can be reduced, whereby the manufacturing cost for the transistor can be reduced, which is preferable.

Next, a method for manufacturing the transistor illustrated in FIGS. 7A to 7C is described with reference to FIGS. 20A to 20D.

First, a conductive film is formed over the substrate 100 by a sputtering method, an evaporation method, or the like, and is processed to form the gate electrode 704. Then, the gate insulating film 712 covering the gate electrode 704 is formed (see FIG. 20A).

Figure 20A:
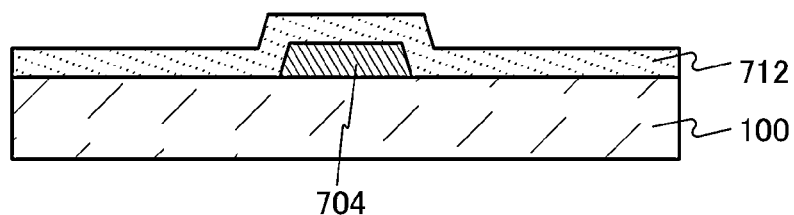
FIGS. 20A to 20D are cross-sectional views each illustrating an example of a manufacturing method of a transistor according to one embodiment of the present invention.
Figure 20B:
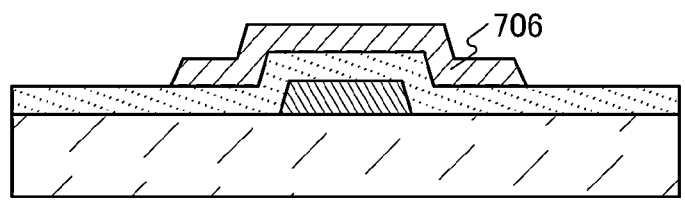
Figure 20C:
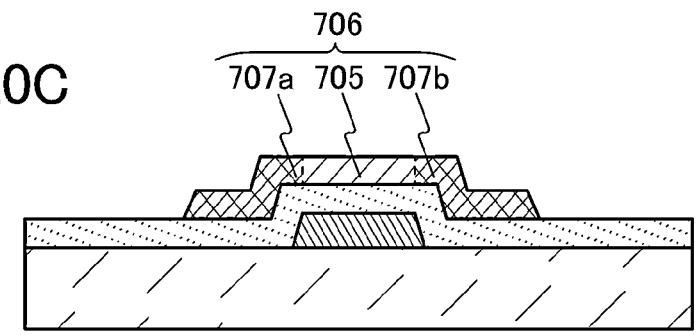
Figure 20D:
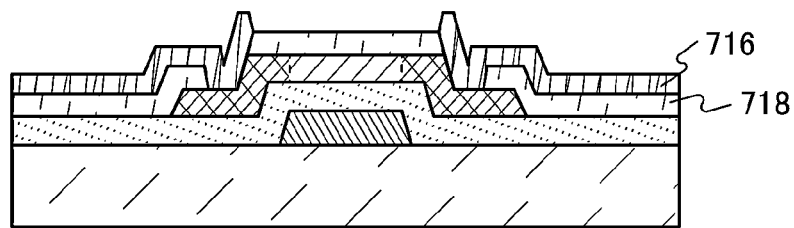

Next, an oxide semiconductor film is formed, and is processed to form the oxide semiconductor film 706 (see FIG. 20B).

Then, a resist mask is used, at least one of a nitrogen ion having a concentration higher than or equal to $1\times10^{19}$ cm$^{-3}$ and lower than or equal to $1\times10^{22}$ cm$^{-3}$, a hydrogen ion having a concentration higher than or equal to $1\times10^{20}$ cm$^{-3}$ and lower than or equal to $3\times10^{22}$ cm$^{-3}$, and an oxygen ion having a concentration higher than or equal to $1\times10^{20}$ cm$^{-3}$ and lower than or equal to $3\times10^{22}$ cm$^{-3}$ is added to a part of the oxide semiconductor film 706. By the addition, a microvoid can be formed in a part of the oxide semiconductor film 706. Then, heat treatment performing at a temperature higher than or equal to 200° C. and lower than or equal to 700° C., preferably at a temperature higher than or equal to 300° C. and lower than or equal to 650° C., hydrogen can be captured in the microvoid, and the channel region 705, the source region 707a, and the drain region 707b are formed (see FIG. 20C).

Next, the interlayer insulating film 718 is formed over the oxide semiconductor film 706 and the gate insulating film 712, and opening portions in which the source region 707a and the drain region 707b is exposed is formed. Then, a conductive film is formed by a sputtering method, an evaporation method, or the like, and the conductive film is processed to form the pair of electrodes 716 which is in contact with the oxide semiconductor film 706 (see FIG. 20D).

Through the above-described process, the transistor illustrated in FIGS. 7A to 7C can be manufactured.

This embodiment can be implemented in appropriate combination with the other embodiments.

Embodiment 9

In this embodiment, a liquid crystal display device manufactured using any of the transistors described in Embodiments 2 to 8 is described. Note that an example in which one embodiment of the present invention is applied to a liquid crystal display device is described in this embodiment; however, the present invention is not limited to this embodiment. For example, application of one embodiment of the present invention to an electroluminescence (EL) display device is readily conceived by those skilled in the art.

Figure 8:
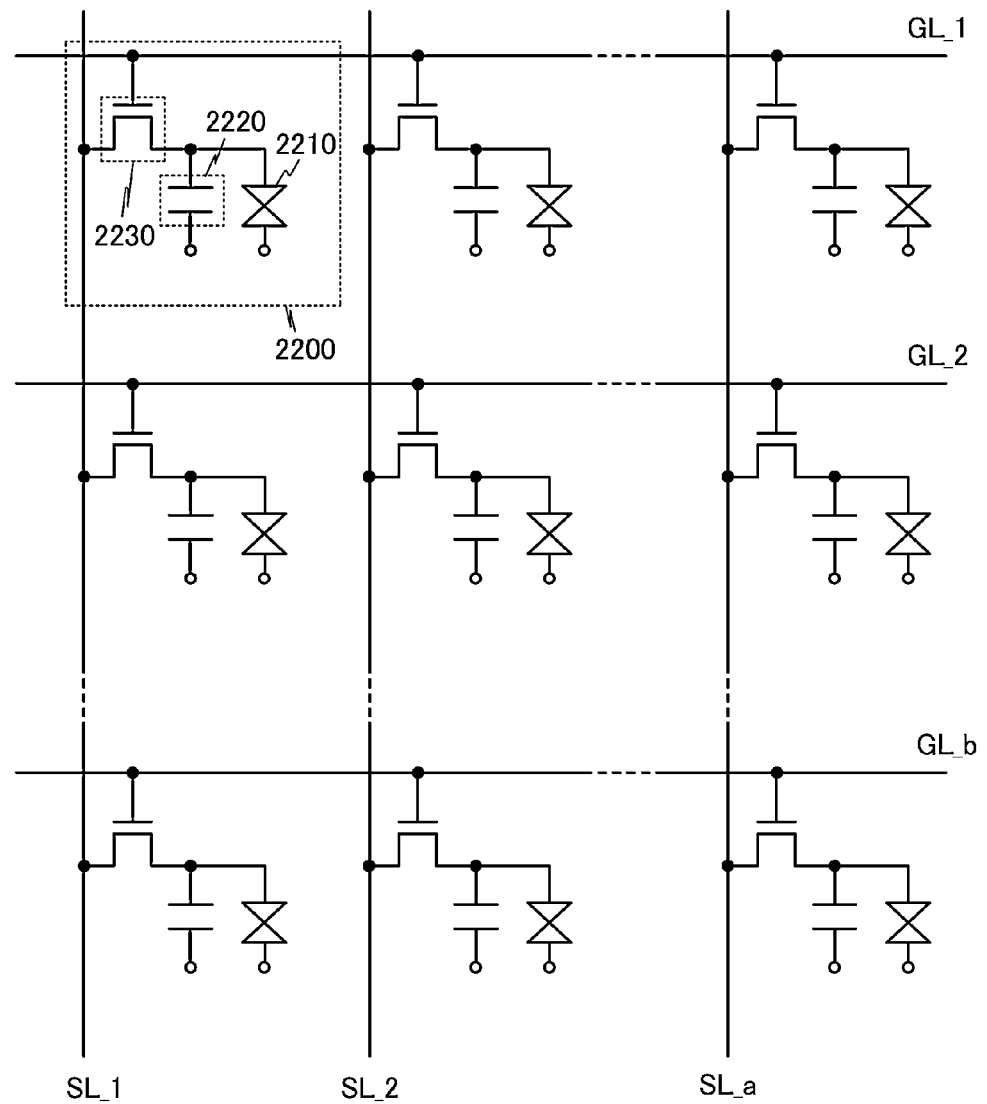
FIG. 8 is a circuit diagram illustrating an example of a liquid crystal display device including a transistor according to one embodiment of the present invention.

FIG. 8 is a circuit diagram of an active matrix liquid crystal display device. The liquid crystal display device includes source lines SL_1 to SL_a, gate lines GL_1 to GL_b, and a plurality of pixels 2200. The pixels 2200 each include a transistor 2230, a capacitor 2220, and a liquid crystal element 2210. The plurality of pixels 2200 with such a structure forms a pixel portion of the liquid crystal display device. In the case where the source line or the gate line is simply mentioned, it is denoted as the source line SL or the gate line GL.

As the transistor 2230, any of the transistors described in Embodiments 2 to 8 is used. Since an oxide semiconductor is used for any transistor which is one embodiment of the present invention, the transistor has excellent electric characteristics, whereby a display device with high image quality can be provided.

The gate line GL is connected to a gate of the transistor 2230, the source line SL is connected to a source electrode of the transistor 2230, and a drain electrode of the transistor 2230 is connected to one capacitor electrode of the capacitor 2220 and one pixel electrode of the liquid crystal element 2210. The other capacitor electrode of the capacitor 2220 and the other pixel electrode of the liquid crystal element 2210 are connected to a common electrode. Note that the common electrode may be formed in the same layer as the gate line GL using the same material as the gate line GL.

Further, the gate line GL is connected to a gate driver circuit. The gate driver circuit may include any of the transistors described in Embodiments 2 to 8.

The source line SL is connected to a source driver circuit. The source driver circuit may include any of the transistors described in Embodiments 2 to 8.

Note that either or both of the gate driver circuit and the source driver circuit may be formed separately and connected using a method such as chip on glass (COG), wire bonding, or tape automated bonding (TAB).

Since a transistor is easily broken by static electricity or the like, a protection circuit is preferably provided. The protection circuit is preferably formed using a nonlinear element.

When a voltage is applied to the gate line GL to be higher than or equal to the threshold voltage of the transistor 2230, electric charge supplied from the source line SL flows as a drain current of the transistor 2230 and is stored in the capacitor 2220. After charging for one row is performed, the transistors 2230 in the row are turned off, and the voltage is not given from the source line SL. However, the necessary voltage can be held by the electric charge stored in the capacitor 2220. Then, the capacitors 2220 in the next row are charged. In such a manner, charging for the first row to b-th row is performed.

In the case of using a transistor having a small off-state current as the transistor 2230, the period for which the voltage can be kept can be lengthened. By this effect, the display rewriting frequency can be reduced in the case of displaying an image with little motion (including a still image); accordingly, further reduction of the power consumption is possible. Further, the capacitance of the capacitor 2220 can be further reduced; accordingly, power consumed for charging can be reduced.

As described above, according to one embodiment of the present invention, a liquid crystal display device with high image quality and low power consumption can be provided.

This embodiment can be implemented in appropriate combination with the other embodiments.

Embodiment 10

In this embodiment, an example of manufacturing a semiconductor memory device using the transistor described in Embodiments 2 to 8 is described.

Typical examples of a volatile semiconductor memory device include a dynamic random access memory (DRAM) which stores data in such a manner that a transistor included in a memory element is selected and electric charge is accumulated in a capacitor, and a static random access memory (SRAM) which holds stored data using a circuit such as a flip-flop.

A typical example of a nonvolatile semiconductor memory device includes a flash memory which has a node between a gate and a channel formation region of a transistor and stores data by holding electric charge in the node.

Any of the transistors described in Embodiments 2 to 8 can be applied to part of transistors included in the above-described semiconductor memory device.

First, a memory cell which is the semiconductor memory device to which the transistor described in Embodiments 2 to 8 is applied is described with reference to FIGS. 9A and 9B.

Figure 9A:
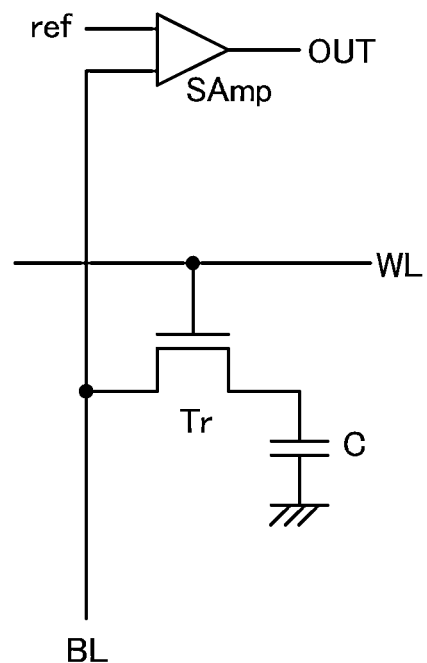
FIGS. 9A and 9B are a circuit diagram illustrating an example of a semiconductor memory device including a transistor according to one embodiment of the present invention and a graph illustrating electrical characteristics.

The memory cell includes a bit line BL, a word line WL, a sense amplifier SAmp, a transistor Tr, and a capacitor C (see FIG. 9A).

Figure 9B:
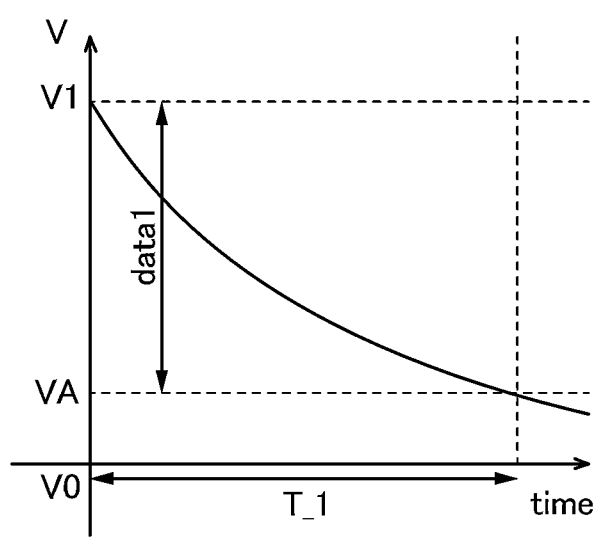

It is known that the potential held in the capacitor is gradually decreased with time as shown in FIG. 9B owing to the off-state current of the transistor Tr. After a certain period of time, the potential originally charged from V0 to V1 is decreased to VA which is a limit for reading data 1. This period is called a holding period T_1. In the case of a two-level memory cell, refresh needs to be performed within the holding period T_1.

When the transistor described in Embodiments 2 to 8 is employed as the transistor Tr, the holding period T_1 can be made longer because the off-state current of the transistor is small. That is, frequency of the refresh operation can be reduced; thus, power consumption can be reduced. For example, when a memory cell is formed using a transistor in which the off-state current is less than or equal to $1 \times 10^{-21}$ A, preferably less than or equal to $1 \times 10^{-24}$ A, data can be held for several days to several decades without supply of power.

As described above, using one embodiment of the present invention, a semiconductor memory device having high reliability and low power consumption can be provided.

Next, a memory cell included in a semiconductor memory device to which any of the transistors described in Embodiments 2 to 8 is applied is described with reference to FIGS. 10A and 10B.

Figure 10A:
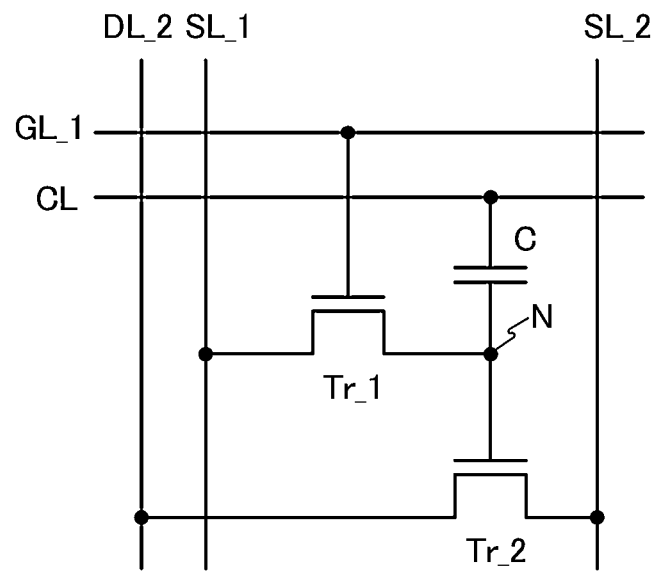
FIGS. 10A and 10B are circuit diagrams illustrating an example of a semiconductor memory device including a transistor according to one embodiment of the present invention and a graph illustrating electrical characteristics.
Figure 10B:
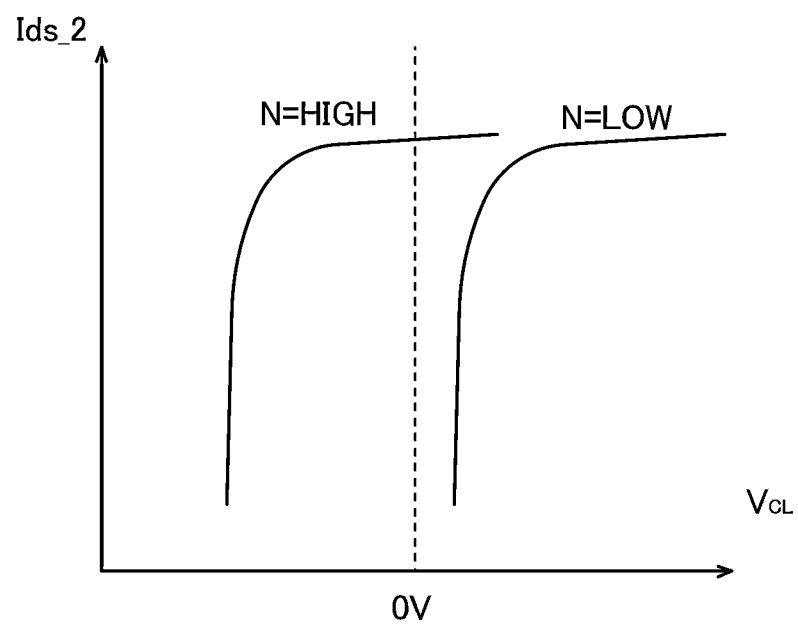

FIG. 10A is a circuit diagram of a memory cell. The memory cell includes a transistor Tr_1, a gate line GL_1 connected to a gate of the transistor Tr_1, a source line SL_1 connected to a source of the transistor Tr_1, a transistor Tr_2, a source line SL_2 connected to a source of the transistor Tr_2, a drain line DL_2 connected to a drain of the transistor Tr_2, a capacitor C, a capacitor line CL connected to one of ends of the capacitor C, and a node N connected to the other end of the capacitor C, a drain of the transistor Tr_1, and a gate of the transistor Tr_2.

The semiconductor memory cell described in this embodiment utilizes variation in an apparent threshold voltage of the transistor Tr_2, which depends on the potential of the node N. For example, FIG. 10B shows a relation between a potential $V_{CL}$ of the capacitor wiring CL and a drain current $I_{ds\_2}$ flowing through the transistor Tr_2.

The voltage of the node N can be controlled through the transistor Tr_1. For example, the potential of the source line SL_1 is set to $V_{DD}$. In this case, when the voltage of the gate line GL_1 is set to be higher than or equal to the potential obtained by adding $V_{DD}$ to the threshold voltage $V_{th}$ of the transistor Tr_1, the potential of the node N can be HIGH. Further, when the potential of the gate line GL_1 is set to be lower than or equal to the threshold voltage $V_{th}$ of the transistor Tr_1, the potential of the node N can be LOW.

Thus, either a $V_{CL}$-$I_{ds\_2}$ curve (N=LOW) or a $V_{CL}$-$I_{ds\_2}$ curve (N=HIGH) can be obtained. That is, when N=LOW, the $I_{ds\_2}$ is small at a $V_{CL}$ of 0V; accordingly, data 0 is stored. Further, when N=HIGH, the $I_{ds\_2}$ is large at a $V_{CL}$ of 0V; accordingly, data 1 is stored. In this manner, data can be stored.

Since the off-state current of any of the transistors described in Embodiments 2 to 8 can be made to be extremely small, if the transistor is used as the transistor Tr_1 here, unintentional leak of electric charge accumulated in the node N between the source and the drain of the transistor Tr_1 can be suppressed. Therefore, data can be held for a long period.

Note that any of the transistors described in Embodiments 2 to 8 may also be applied to the transistor Tr_2.

Next, the memory cell included in the semiconductor memory device shown in FIGS. 10A and 10B without the capacitor is described with reference to FIG. 11.

Figure 11:
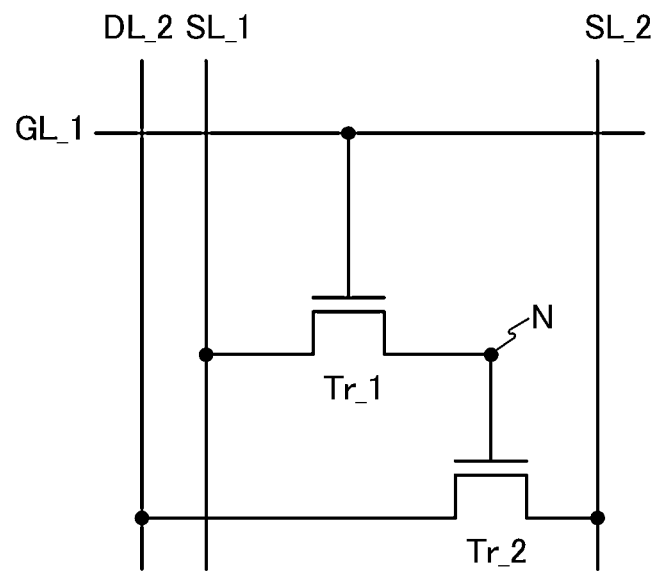
FIG. 11 is a circuit diagram illustrating an example of a semiconductor memory device including a transistor according to one embodiment of the present invention.

FIG. 11 is a circuit diagram of a memory cell. The memory cell includes a transistor Tr_1, a gate line GL_1 connected to a gate of the transistor Tr_1, a source line SL_1 connected to a source of the transistor Tr_1, a transistor Tr_2, a source line SL_2 connected to a source of the transistor Tr_2, a drain line DL_2 connected to a drain of the transistor Tr_2, a gate of the transistor Tr_2 connected to a drain of the transistor Tr_1, and a node N connected to the drain of the transistor Tr_1 and the gate of the transistor Tr_2.

In the case where the normally off transistor whose off-state current is extremely small is used as the transistor Tr_1, electric charge can be held in the node N which is between the drain of the transistor Tr_1 and the gate of the transistor Tr_2 without the capacitor. The structure without the capacitor makes it possible to reduce an area of a memory cell, so that the integration degree of a memory module using the memory cell can be more increased than that of the structure with a capacitor. However, in the case where the transistor Tr_1 is normally on or the off-state current is a little large, the threshold voltage of the transistor Tr_1 can be controlled by providing a backgate, a transistor, or a diode.

Although the semiconductor memory device including four or five wirings is described in this embodiment, a structure of the nonvolatile memory is not limited thereto. For example, a structure in which one wiring functions as the source line SL_1 and the drain line DL_2 may be employed.

As described above, according to one embodiment of the present invention, a semiconductor memory device with high reliability for a long period, low power consumption, and a high degree of integration can be obtained.

This embodiment can be implemented in appropriate combination with the other embodiments.

Embodiment 11

A central processing unit (CPU) can be formed using a transistor including an oxide semiconductor in an active layer for at least part of the CPU.

Figure 12A:
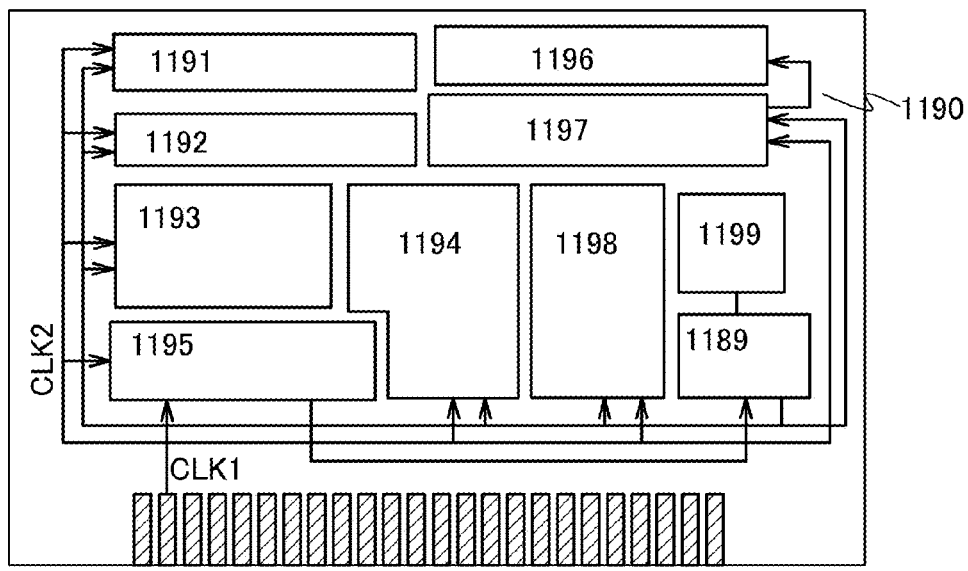
FIGS. 12A to 12C are a block diagram illustrating a specific example of a CPU including a transistor according to one embodiment of the present invention and circuit diagrams each illustrating part of the CPU.

FIG. 12A is a block diagram illustrating a specific structure of a CPU. The CPU shown in FIG. 12A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The rewritable ROM 1199 and the ROM interface 1189 may be provided over a separate chip. Obviously, the CPU illustrated in FIG. 12A is only an example in which the configuration is simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 12A, a semiconductor memory device is provided in the register 1196. The semiconductor memory device described in Embodiment 10 can be used as the memory element provided in the register 1196.

In the CPU illustrated in FIG. 12A, the register controller 1197 selects an operation of holding data in the register 1196 in accordance with an instruction from the ALU 1191. That is, the register controller 1197 selects whether data is held by a phase-inversion element or a capacitor in the memory element included in the register 1196. When data holding by the phase-inversion element is selected, a power supply voltage is supplied to the memory element in the register 1196. When data holding by the capacitor is selected, the data is rewritten in the capacitor, and supply of a power supply voltage to the memory element in the register 1196 can be stopped.

Figure 12B:
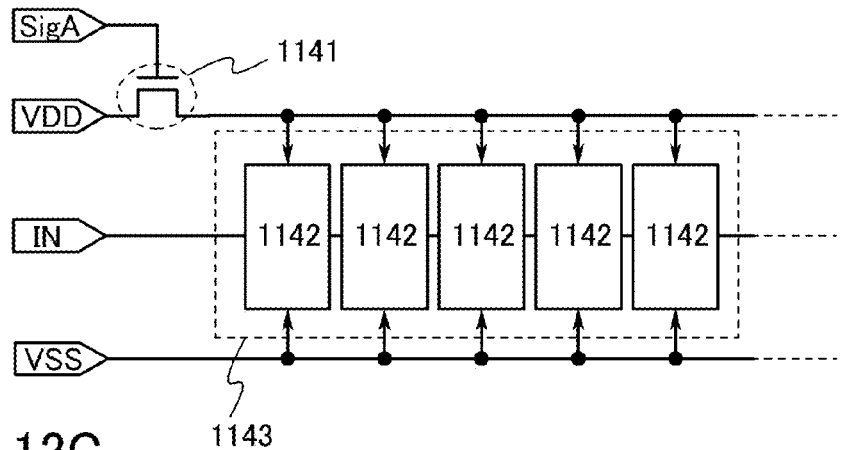
Figure 12C:
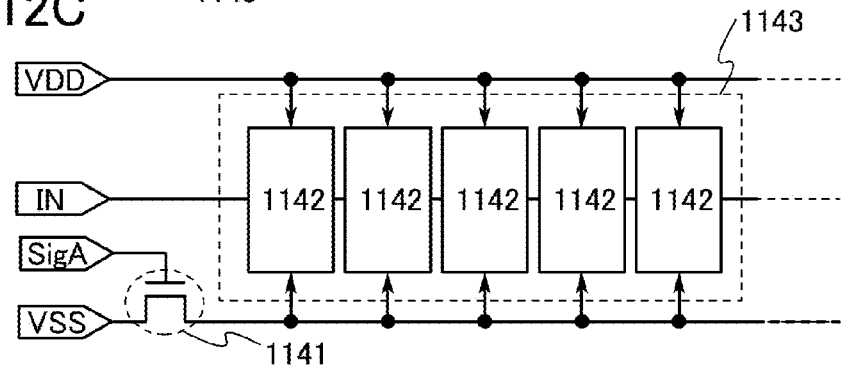

The power supply can be stopped by providing a switching element between a memory element group and a node to which a power supply potential $V_{DD}$ or a power supply potential $V_{SS}$ is supplied, as illustrated in FIG. 12B or FIG. 12C. Circuits illustrated in FIGS. 12B and 12C are described below.

FIGS. 12B and 12C each illustrate an example of a structure of a memory circuit including a transistor including an oxide semiconductor in an active layer as a switching element for controlling supply of a power supply potential to a memory element.

The memory device illustrated in FIG. 12B includes a switching element 1141 and a memory element group 1143 including a plurality of memory elements 1142. Specifically, as each of the memory elements 1142, the memory element described in Embodiment 5 can be used. Each of the memory elements 1142 included in the memory element group 1143 is supplied with the high-level power supply potential $V_{DD}$ via the switching element 1141. Further, each of the memory elements 1142 included in the memory element group 1143 is supplied with a potential of a signal IN and the low-level power supply potential $V_{SS}$.

In FIG. 12B, any of the transistors whose off-state current is extremely small described in Embodiments 2 to 8 is used as the switching element 1141, and the switching of the transistor is controlled by a signal SigA supplied to a gate electrode thereof.

Note that FIG. 12B illustrates the structure in which the switching element 1141 includes only one transistor; however, without limitation thereto, the switching element 1141 may include a plurality of transistors. In the case where the switching element 1141 includes a plurality of transistors which serve as switching elements, the plurality of transistors may be connected to each other in parallel, in series, or in combination of parallel connection and series connection.

Although the switching element 1141 controls the supply of the high-level power supply potential $V_{DD}$ to each of the memory elements 1142 included in the memory element group 1143 in FIG. 12B, the switching element 1141 may control the supply of the low-level power supply potential $V_{SS}$.

In FIG. 12C, an example of a memory device in which each of the memory elements 1142 included in the memory element group 1143 is supplied with the low-level power supply potential $V_{SS}$ via the switching element 1141 is illustrated. The supply of the low-level power supply potential $V_{SS}$ to each of the memory elements 1142 included in the memory element group 1143 can be controlled by the switching element 1141.

When a switching element is provided between a memory element group and a node to which the power supply potential $V_{DD}$ or the power supply potential $V_{SS}$ is supplied, data can be held even in the case where operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

This embodiment can be implemented in appropriate combination with the other embodiments.

Embodiment 12

In this embodiment, examples of electronic devices to which any of Embodiments 2 to 11 is applied are described.

Figure 13A:
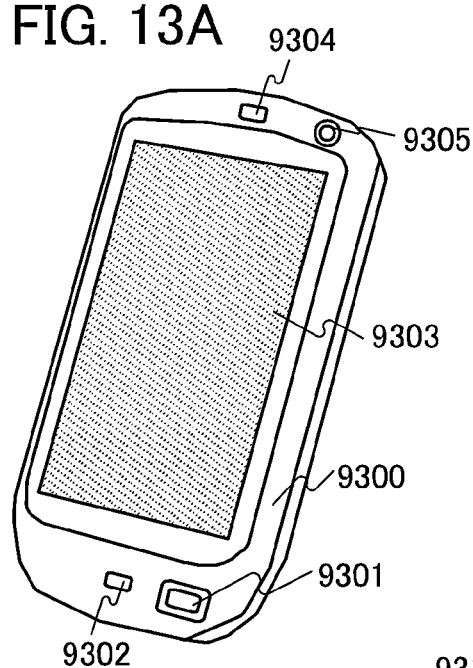
FIGS. 13A to 13C are perspective views illustrating examples of electronic devices each including a semiconductor device that is one embodiment of the present invention.

FIG. 13A illustrates a portable information terminal, which includes a housing 9300, a button 9301, a microphone 9302, a display portion 9303, a speaker 9304, and a camera 9305, and has a function as a mobile phone. One embodiment of the present invention can be applied to the display portion 9303 and the camera 9305. Although not illustrated, one embodiment of the present invention can also be applied to an arithmetic unit, a wireless circuit, or a memory circuit inside the main body.

Figure 13B:
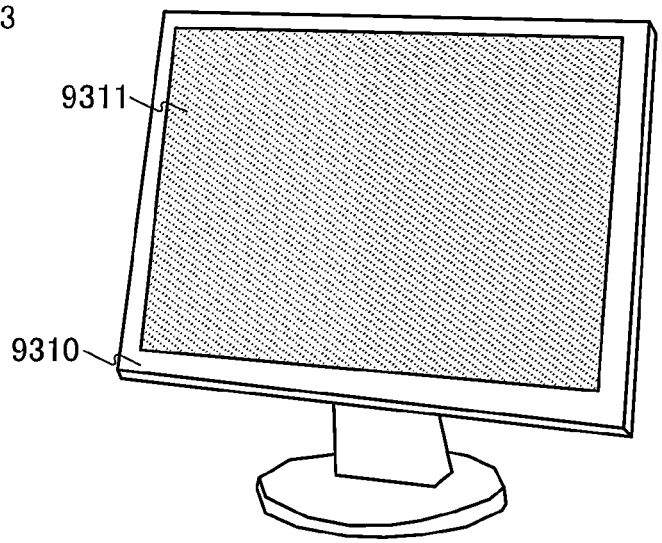

FIG. 13B illustrates a display, which includes a housing 9310 and a display portion 9311. One embodiment of the present invention can be applied to the display portion 9311. When one embodiment of the present invention is employed, a display having high display quality can be provided even in the case where the size of the display portion 9311 is increased.

Figure 13C:
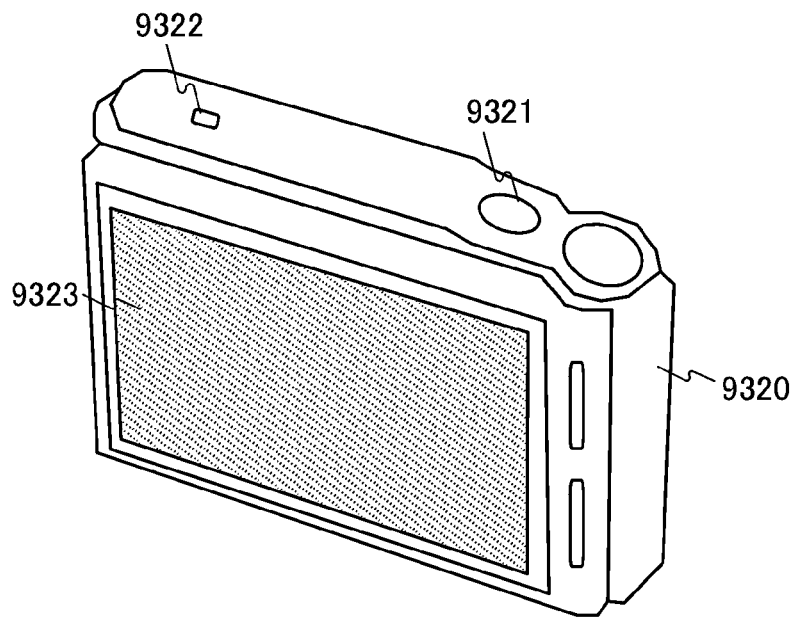

FIG. 13C illustrates a digital still camera, which includes a housing 9320, a button 9321, a microphone 9322, and a display portion 9323. One embodiment of the present invention can be applied to the display portion 9323. Although not illustrated, one embodiment of the present invention can also be applied to a memory circuit or an image sensor.

By applying one embodiment of the present invention, the performance of an electric device can be improved and the reliability of the electric device can be improved.

This embodiment can be implemented in appropriate combination with the other embodiments.

Example 1

In this example, an oxide semiconductor film including a microvoid, which is one embodiment of the present invention is described.

A sample used in this example has a structure in which a silicon oxide film is provided over a glass substrate and an In—Ga—Zn—O film is provided as an oxide semiconductor film over the silicon oxide film was used.

The silicon oxide film was formed to have a thickness of 300 nm by a plasma CVD method.

The oxide semiconductor film was formed with a thickness of 30 nm by a sputtering method. The other conditions were as follows: In—Ga—Zn—O ($In_2O_3$:$Ga_2O_3$:ZnO=1:1:2 [molar ratio]) was used for a target; the electric power for the film formation was set to 500 W (DC); the pressure for the film formation was set to 0.4 Pa; the gas for the film formation was argon at 30 sccm and oxygen at 15 sccm; and the substrate temperature during the film formation was set to 400° C.

Figure 21A:
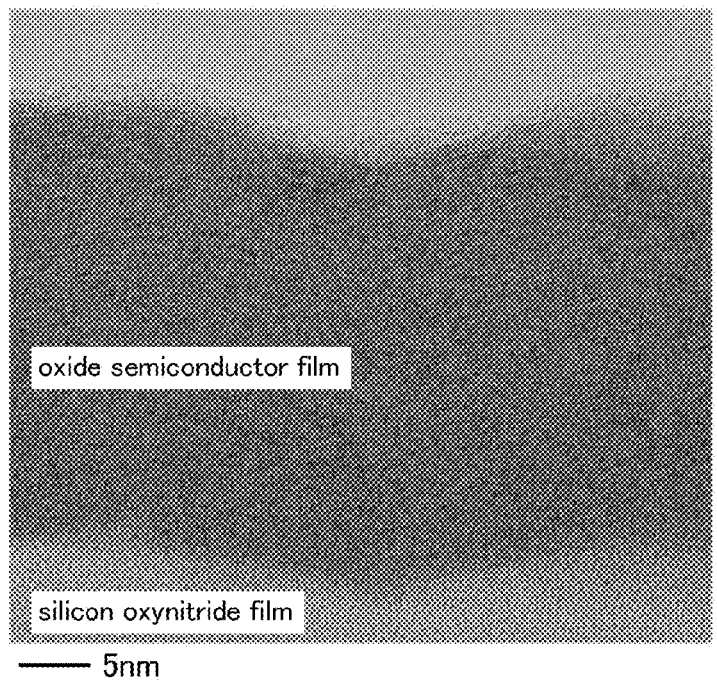
FIGS. 21A and 21B are cross-section observation images obtained with a TEM.
Figure 21B:
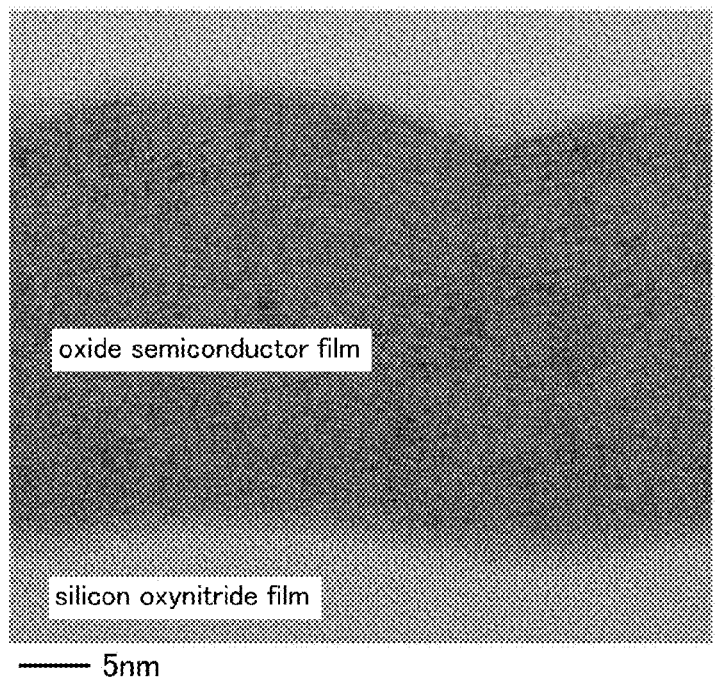

FIGS. 21A and 21B are cross-section observation images (four million-fold magnification) obtained with a transmission electron microscope (TEM): FIG. 21A is the image of a sample in a state immediately after the oxide semiconductor film was formed; and FIG. 21B is the image of a sample on which heat treatment was performed at 650° C. for 1 hour in a nitrogen atmosphere after the formation of the oxide semiconductor film. Note that H-9000NAR manufactured by Hitachi, Ltd was used as the TEM, and the images were observed with the acceleration voltage of 300 kV.

It is found that the sample on which heat treatment was performed at 650° C. after the film formation has c-axis alignment perpendicularly to the surface on the surface side of the oxide semiconductor film.

Figure 22A:
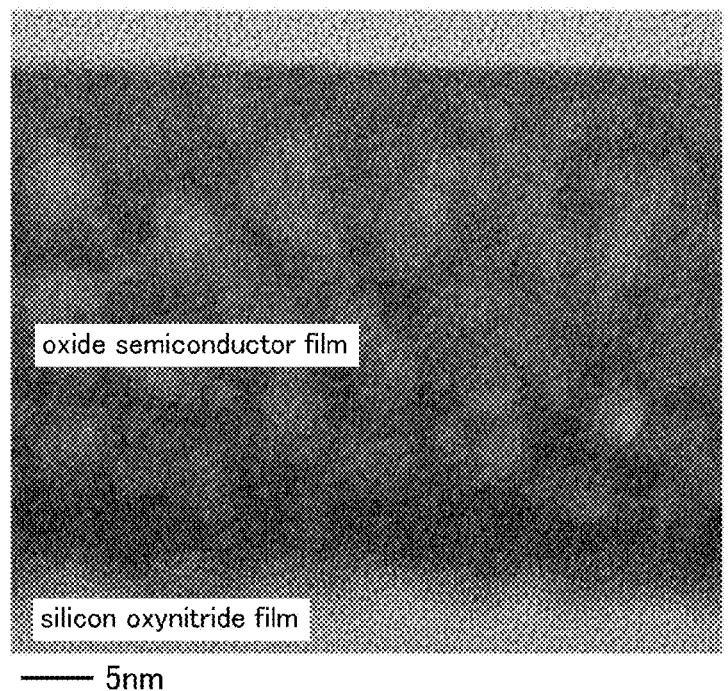
FIGS. 22A and 22B are cross-section observation images obtained with the TEM.
Figure 22B:
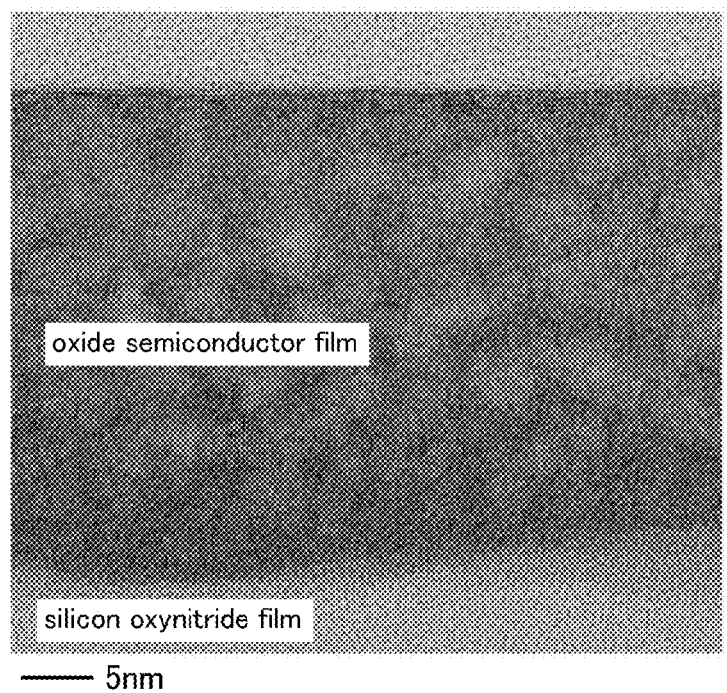

FIGS. 22A and 22B are cross-section observation images (four million-fold magnification) obtained with the TEM: FIG. 22A is the image of a sample to which $N^+$ ion was added after the formation of the oxide semiconductor film; and FIG. 22B is the image of a sample to which $N^+$ ion was added after the formation of the oxide semiconductor film and on which heat treatment was performed at 650° C. for 1 hour in a nitrogen atmosphere. In this example, by an ion implantation method, $N^+$ ions were added under the following condition: the concentration of $N^+$ ions was $5.0 \times 10^{16}$ $cm^{-2}$; an accelerating voltage was 10 kV; a tilt angle was 7° C.; and a twist angle was 72° C.

It is found that both of the samples include microvoids with almost a spherical shape (portions displayed brightly in the cross-section observation images obtained with the TEM) in the oxide semiconductor film. In particular, in the sample on which heat treatment was performed at 650° C. for 1 hour in a nitrogen atmosphere, the peripheral portion of microvoids are clearly seen. Moreover, on a surface side in the oxide semiconductor film, c-axis alignment perpendicular to the surface is formed, and a region with high crystallinity can be seen in the vicinity of the microvoid in the oxide semiconductor film. Crystal portions which are in contact with peripheral portions of the microvoids are c-axis aligned to the normal direction of the surface which is in contact with the peripheral portion of the microvoid.

Figure 23A:
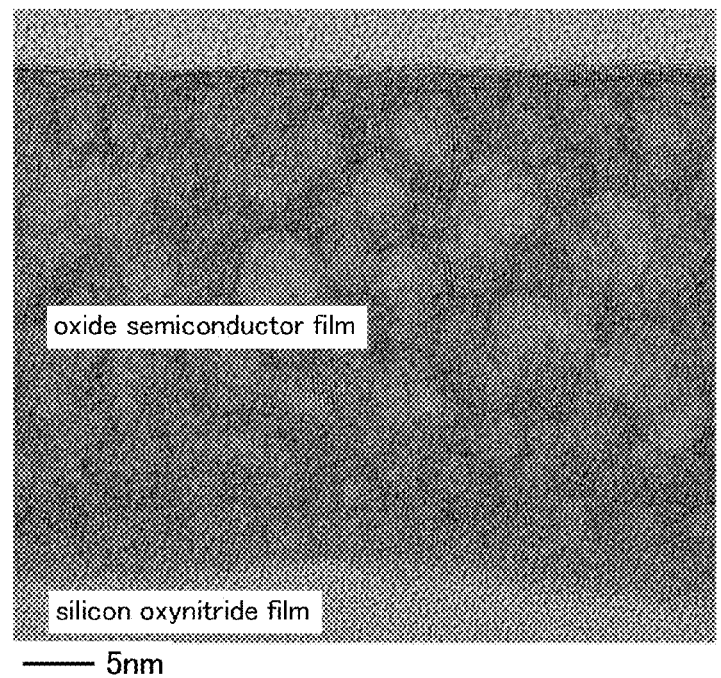
FIGS. 23A and 23B are cross-section observation images obtained with the TEM.
Figure 23B:
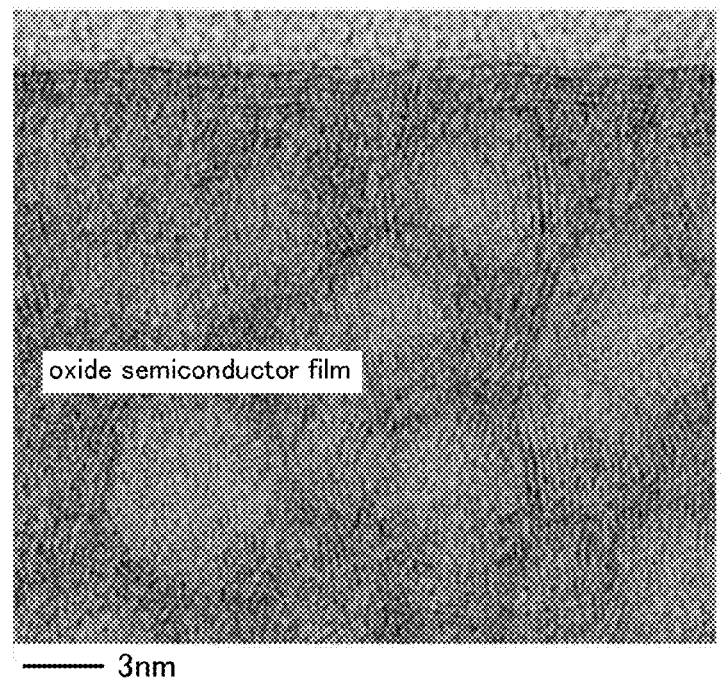

FIG. 23A is a cross-section observation image obtained, with the TEM (four million-fold magnification), of a sample to which $N^+$ ion was added after the formation of the oxide semiconductor film and on which heat treatment was performed at 650° C. for 1 hour in an oxygen atmosphere. FIG. 23B is a cross-section observation image obtained, with the TEM (eight million-fold magnification), of the same sample.

It is found that the sample includes microvoids with almost a spherical shape in the oxide semiconductor film. The peripheral portion of microvoids of this sample is observed more clearly the sample on which heat treatment was performed in a nitrogen atmosphere. Moreover, on a surface side in the oxide semiconductor film, c-axis alignment perpendicular to the surface is formed, and a region with high crystallinity can be seen in the vicinity of the microvoid in the oxide semiconductor film. Crystal portions which are in contact with peripheral portions of the microvoids are c-axis aligned to the normal direction of the surface which is in contact with the peripheral portion of the microvoid.

Next, the microvoid was observed in more detail with use of a high-angle annular dark field scanning transmission electron microscopy (HAADF-STEM). A Hitachi scanning transmission electron microscope HD-2700 was used as the HAADF-STEM, and the microvoid was observed with an acceleration voltage of 200 kV.

Figure 24A:
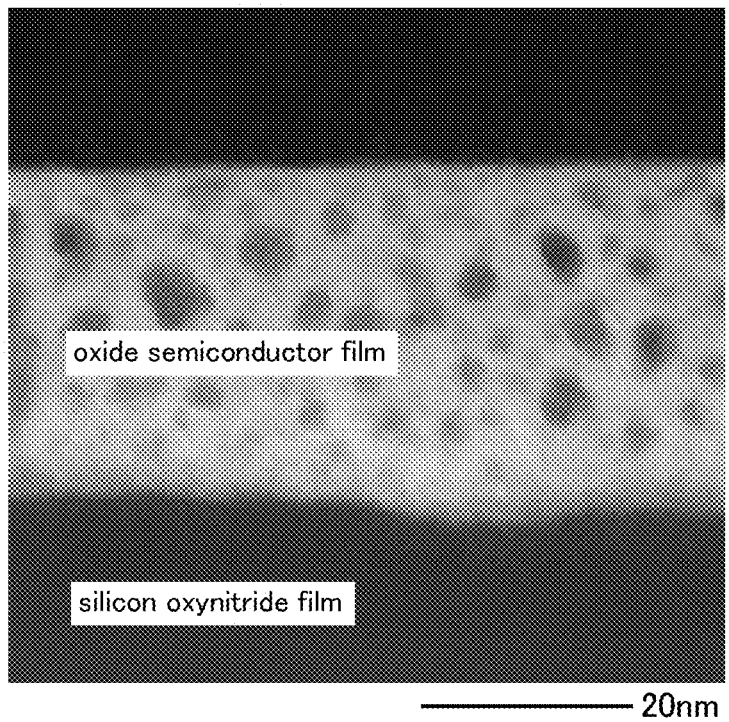
FIG. 24A is a cross-section observation image obtained with the HAADF-STEM.
Figure 24B:
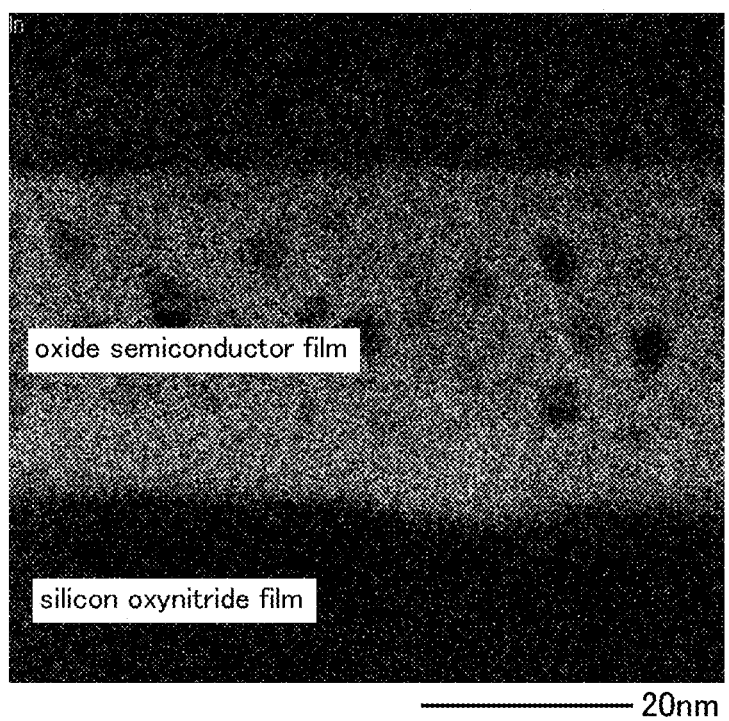
FIG. 24B is a cross-section observation image showing the distribution of elements observed by EELS.

FIG. 24A is a cross-section observation image obtained, with the HAADF-STEM (1.5 million-fold magnification), of a sample to which $N^+$ ion was added after the formation of the oxide semiconductor film and on which heat treatment was performed at 650° C. for 1 hour in an oxygen atmosphere. By using the HAADF-STEM, the sample can be observed to emphasize gradation. In addition, distribution of In in the observation portion was examined by electron energy loss spectroscopy (EELS), and the examined portion is shown in FIG. 24B.

Figure 25A:
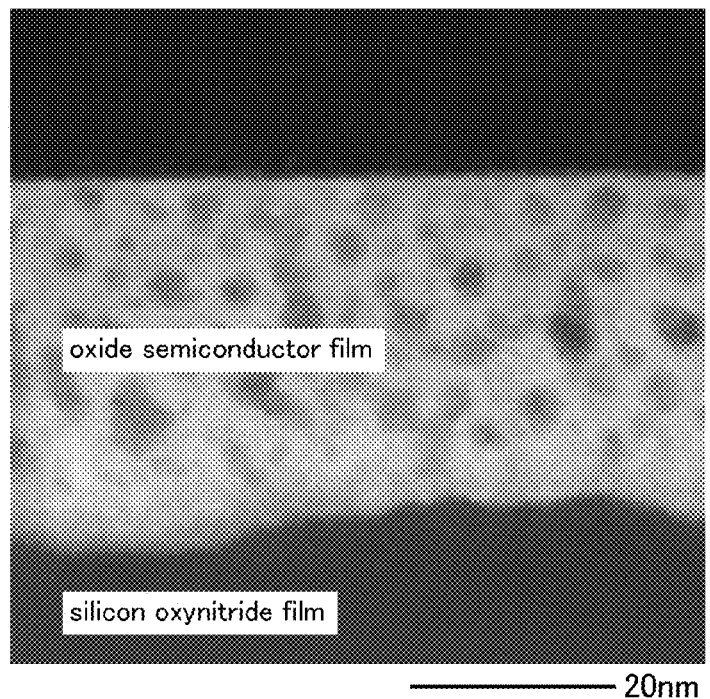
FIG. 25A is a cross-section observation image obtained with the HAADF-STEM.
Figure 25B:
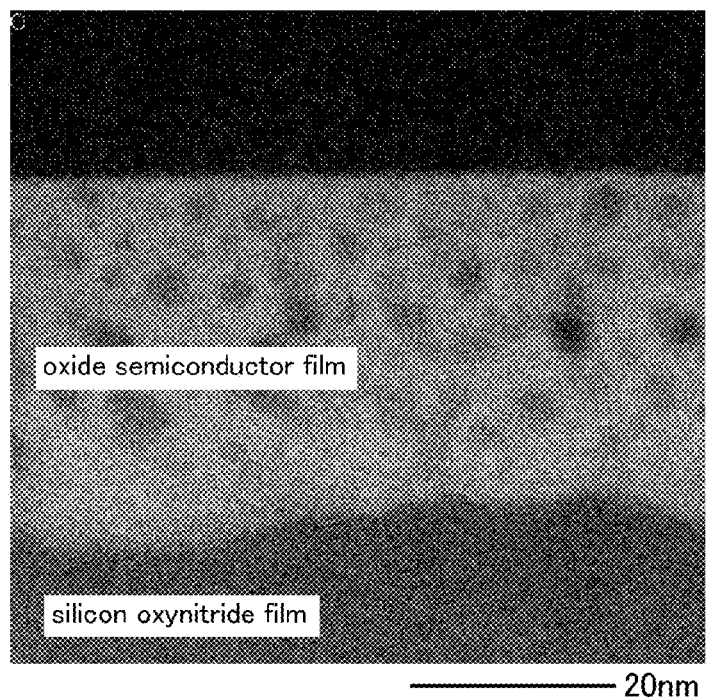
FIG. 25B is a cross-section observation image showing the distribution of elements observed by EELS.

In the same manner, FIG. 25A is a cross-section observation image obtained, with the HAADF-STEM (1.5 million-fold magnification), of a sample to which $N^+$ ion was added after the formation of the oxide semiconductor film, and on which heat treatment was performed at 650° C. for 1 hour in an oxygen atmosphere. Further, distribution of O in the observation portion was examined by EELS, and the examined portion is shown in FIG. 25B.

Figure 26A:
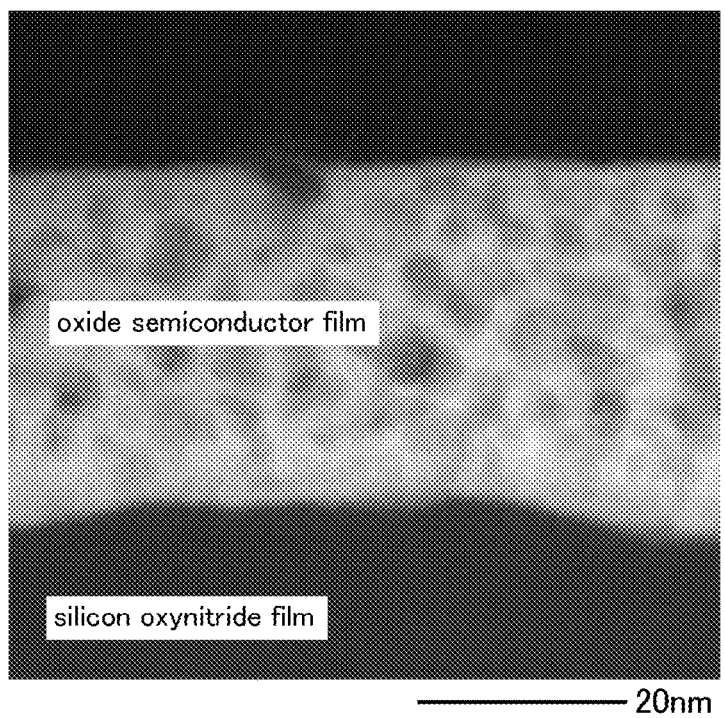
FIG. 26A is a cross-section observation image obtained with the HAADF-STEM.
Figure 26B:
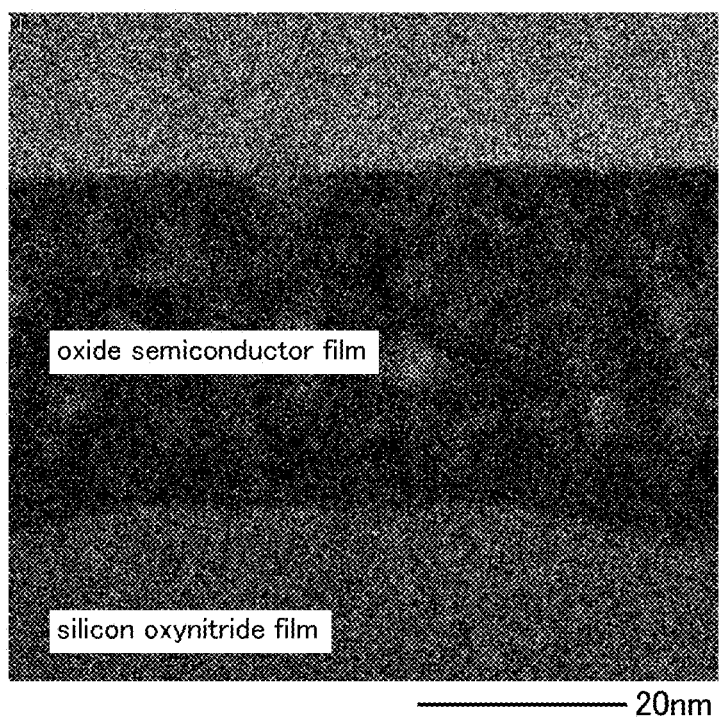
FIG. 26B is a cross-section observation image showing the distribution of elements observed by EELS.

In the same manner, FIG. 26A is a cross-section observation image, obtained with the HAADF-STEM (1.5 million-fold magnification), of a sample to which $N^+$ ion was added after the formation of the oxide semiconductor film, and on which heat treatment was performed at 650° C. for 1 hour in an oxygen atmosphere. Further, distribution of N in the observation portion was examined by EELS, and the examined portion is shown in FIG. 26B.

According to FIGS. 24A and 24B and FIGS. 25A and 25B, it is found that the microvoid in the oxide semiconductor film are brighter than the surrounding part, and In and O which are main components of the oxide semiconductor film are hardly included. That is, it is found that the microvoid has a low density as compared to the surrounding part or an empty space. According to FIGS. 26A and 26B, it is found that the microvoid is darker than the surrounding part, and N is included in the microvoid.

Next, XPS was used to examine a state of added $N^+$ in the oxide semiconductor film.

Figure 27:
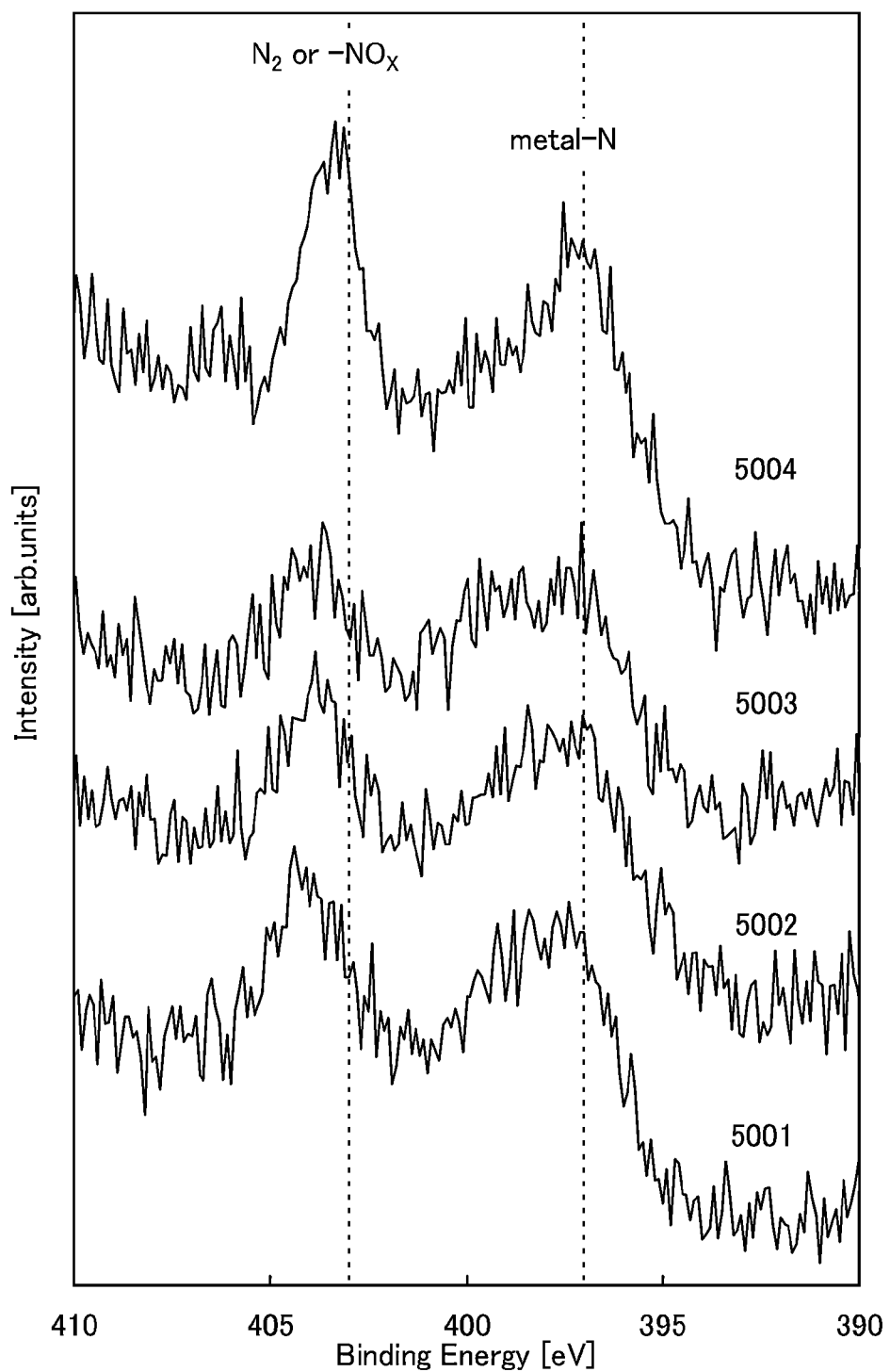
FIG. 27 shows XPS spectra.

FIG. 27 shows XPS spectra including a spectrum 5001 of a sample without heat treatment, a spectrum 5002 of a sample on which heat treatment was performed at 300° C. for 1 hour in a nitrogen atmosphere, a spectrum 5003 of a sample on which heat treatment was performed at 450° C. for 1 hour in a nitrogen atmosphere, and a spectrum 5004 of a sample on which heat treatment was performed at 650° C. for 1 hour in a nitrogen atmosphere. In all the samples, heat treatment was performed after addition of $N^+$ ions to an oxide semiconductor film.

In all spectra in FIG. 27, a peak of $N_2$ or —$NO_X$ appears in the vicinity of a binding energy of 403 eV, and a peak of metal-N appears in the vicinity of a binding energy of 397 eV. That is, it is found that N exists in a bonding state of $N_2$, —$NO_X$, or metal-N in a sample to which $N^+$ ion is added. Here, according to distribution of In and O shown in FIG. 24B and FIG. 25B, it is found that a bonding of —$NO_X$ and metal-N are hardly exist in the microvoid, and N exists as $N_2$ in the microvoid.

According to this example, it is found that the microvoid is formed in the oxide semiconductor film by adding N$^+$ ion to the oxide semiconductor film. In addition, it is found that N$_2$ exists in the microvoid.

Example 2

In this example, a relationship between H and N when N$^+$ ion is added to an oxide semiconductor film is described.

A sample used in this example has a structure in which an In—Ga—Zn—O film is formed as an oxide semiconductor film over a silicon wafer was used.

The oxide semiconductor film was formed to have a thickness of 300 nm by a sputtering method. The other conditions were as follows: In—Ga—Zn—O (In$_2$O$_3$:Ga$_2$O$_3$:ZnO=1:1:2 [molar ratio]) was used for a target; the electric power for the film formation was set to 500 W (DC); the pressure for the film formation was set to 0.4 Pa; the gas for the film formation was argon at 30 sccm and oxygen at 15 sccm; and the substrate temperature during the film formation was set to 200° C.

Figure 28A:
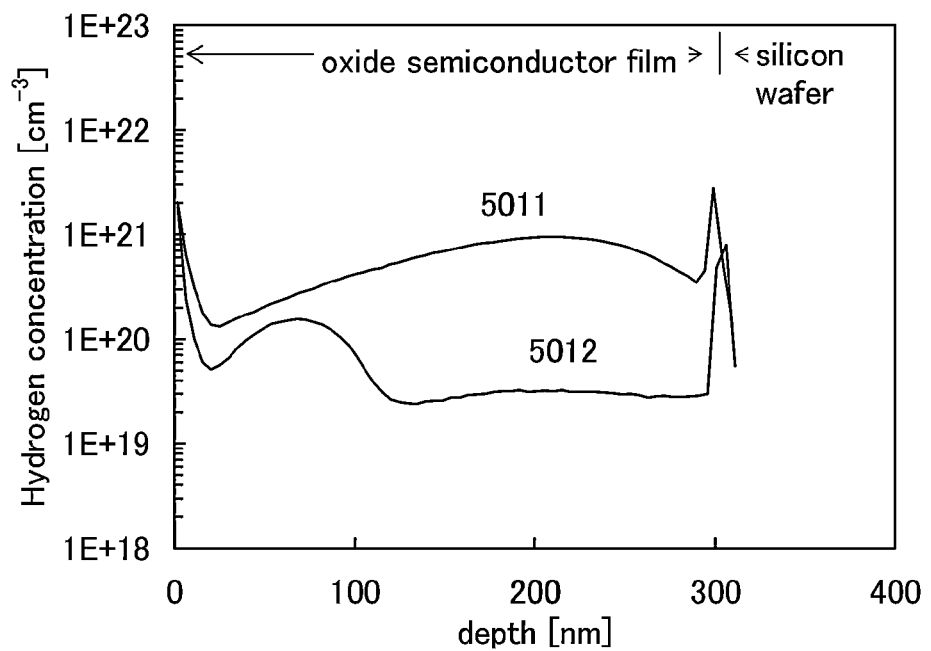
FIGS. 28A and 28B are graphs showing the concentration distribution of hydrogen and nitrogen in the depth direction measured with SIMS.
Figure 28B:
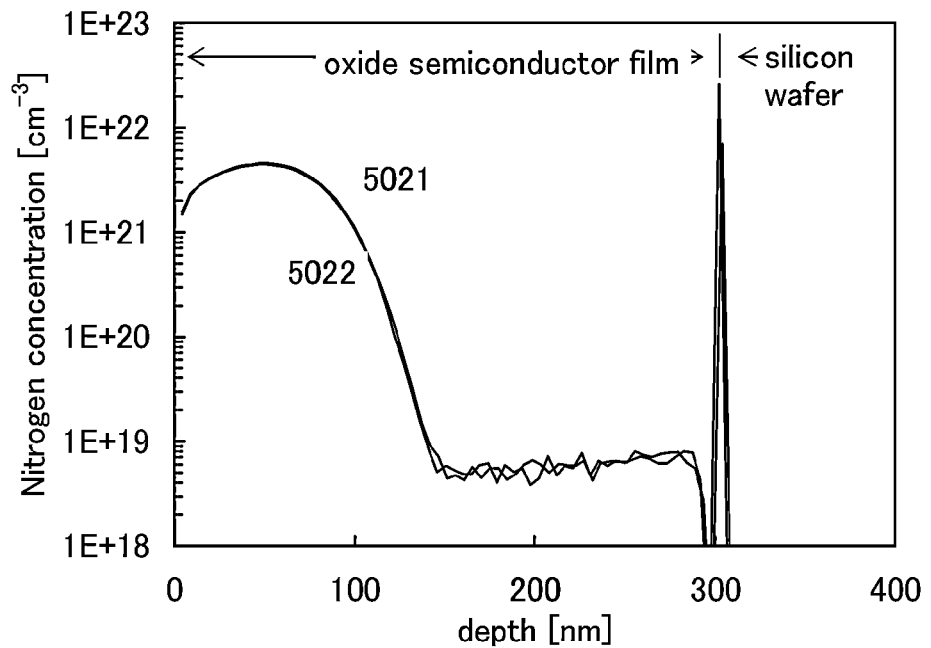

FIG. 28A shows the distribution of a hydrogen concentration in the depth direction measured by SIMS, of a sample without heat treatment (a solid line 5011) and a sample on which heat treatment was performed at 450° C. for 1 hour in hydrogen atmosphere (a solid line 5012). In both of the samples, N$^+$ ion was added after H$^+$ ion had been added. Further, FIG. 28B shows the distribution of a nitrogen concentration in the depth direction measured by SIMS of a sample without heat treatment (a solid line 5021) and a sample on which heat treatment was performed at 450° C. for 1 hour in nitrogen atmosphere (a solid line 5022). In both of the samples, N$^+$ ion was added after H$^+$ ion had been added. By an ion implantation method, H$^+$ ion was added under the following condition: the concentration of N$^+$ ions was $1.0 \times 10^{16}$ cm$^{-2}$; an accelerating voltage was 22 kV; a tilt angle was 7° C.; and a twist angle was 72° C. Further, by an ion implantation method, N$^+$ ion was added under the following condition: the concentration of N$^+$ ions was $1.0 \times 10^{16}$ cm$^{-2}$; an accelerating voltage was 35 kV; a tilt angle was 7° C.; and a twist angle was 72° C.

According to FIG. 28B, there was little difference between the distribution of a nitrogen concentration in the depth direction in the oxide semiconductor film examined after N$^+$ ion and H$^+$ ion had been added to the oxide semiconductor film and the distribution of a nitrogen concentration in the depth direction in the oxide semiconductor film examined after heat treatment had been performed at 450° C. for 1 hour in nitrogen atmosphere. On the other hand, according to FIG. 28A, in the sample without heat treatment, a hydrogen concentration has a peak at a depth in the vicinity of 200 nm, whereas in the sample on which heat treatment was performed at 450° C. for 1 hour in nitrogen atmosphere, a hydrogen concentration has a peak at a depth in the vicinity of 70 nm. This peak position at a depth of the vicinity of 70 nm approximately corresponds to the peak position of a nitrogen concentration in the depth direction shown in FIG. 28B.

Figure 29A:
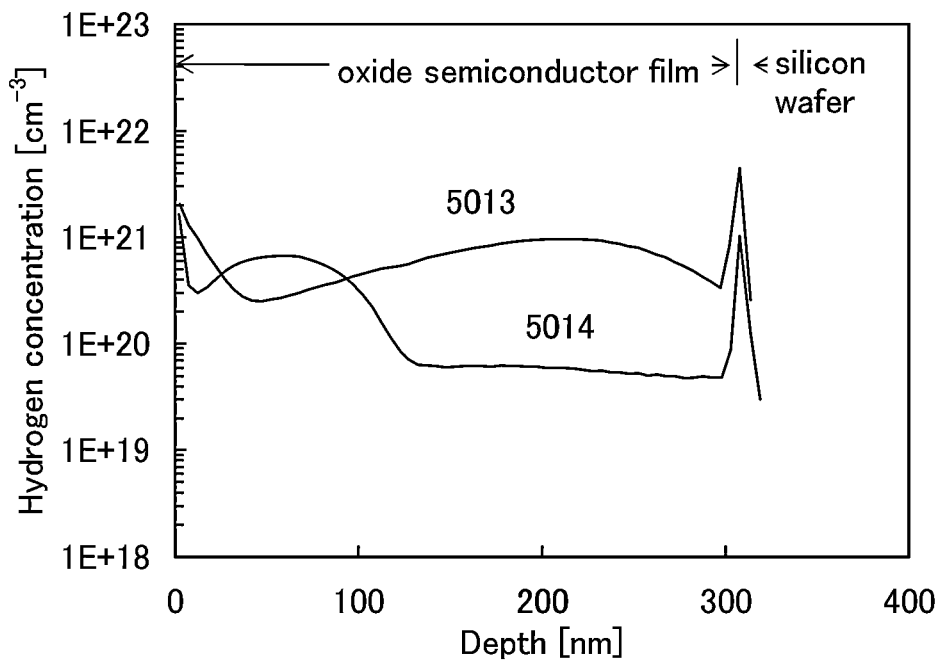
FIGS. 29A and 29B are graphs showing the concentration distribution of hydrogen and nitrogen in the depth direction measured with SIMS.
Figure 29B:
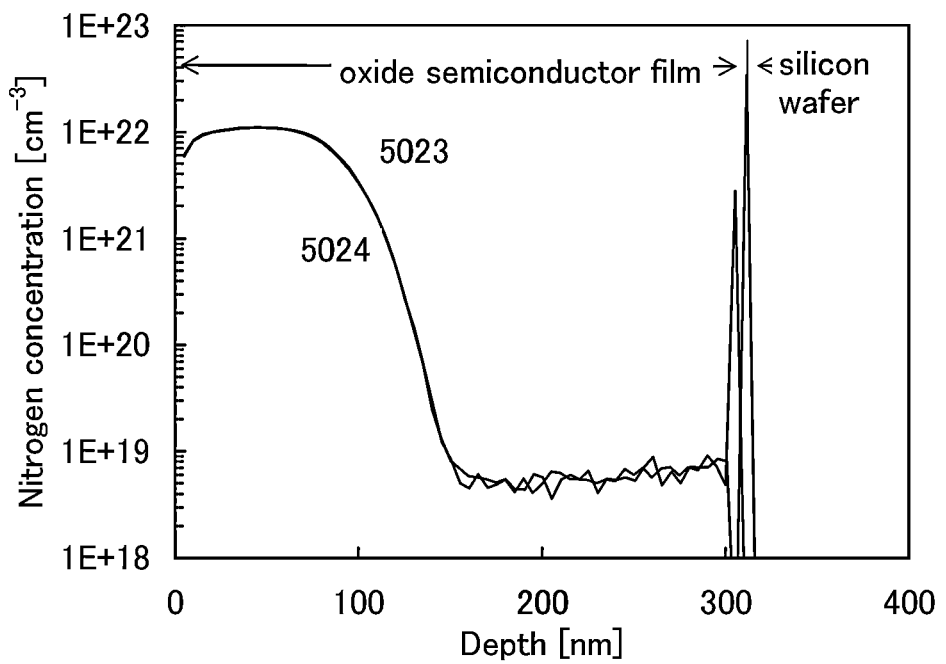

FIGS. 29A and 29B show examples in which the concentration of added N$^+$ ions is different from that in FIGS. 28A and 28B. FIG. 29A shows, H$^+$ ion was added to an oxide semiconductor film, then N$^+$ ion was added to the oxide semiconductor film, distribution of a hydrogen concentration in the depth direction measured by SIMS of a sample without heat treatment (a solid line 5013) and a sample on which heat treatment was performed at 450° C. for 1 hour in a hydrogen atmosphere (a solid line 5014). Further, FIG. 29B shows, after N$^+$ ion and H$^+$ ion are added to the same sample, distribution of a nitrogen concentration in the depth direction measured by SIMS of a sample without heat treatment (a solid line 5023) and a sample on which heat treatment was performed at 450° C. for 1 hour in nitrogen atmosphere (a solid line 5024). By an ion implantation method, H$^+$ ion is added under the condition of the concentration of H$^+$ ions is $1.0 \times 10^{16}$ cm$^{-2}$, and N$^+$ ion is added under the condition of the concentration of N$^+$ ions is $5.0 \times 10^{16}$ cm$^{-2}$. For the other conditions of addition, the explanation of FIGS. 28A and 28B can be referred to.

According to FIG. 29B, there was little difference between the distribution of a nitrogen concentration in the depth direction in the oxide semiconductor film examined after N$^+$ ion and H$^+$ ion had been added to the oxide semiconductor film and the distribution of a nitrogen concentration in the depth direction in the oxide semiconductor film examined after heat treatment had been performed at 450° C. for 1 hour in nitrogen atmosphere. On the other hand, according to FIG. 29A, in the sample without heat treatment, a hydrogen concentration has a peak at a depth of the vicinity of 200 nm, whereas in the sample on which heat treatment was performed at 450° C. for 1 hour in nitrogen atmosphere, a hydrogen concentration has a peak at a depth in the vicinity of 70 nm. Note that the hydrogen concentration at this peak position is higher than that in FIGS. 28A and 28B.

According to this example, by adding N$^+$ ion to an oxide semiconductor film and performing heat treatment, it is found that the hydrogen concentration of a region where N$^+$ ion is added in the oxide semiconductor film is increased.

REFERENCE NUMERALS

100: substrate, 104: gate electrode, 105: channel region, 106: oxide semiconductor film, 107a: source region, 107b: drain region, 112: gate insulating film, 116: a pair of electrodes, 118: interlayer insulating film, 205: channel region, 206: oxide semiconductor film, 207a: source region, 207b: drain region, 216: a pair of electrodes, 218: interlayer insulating film, 302: base insulating film, 304: gate electrode, 305: channel region, 306: oxide semiconductor film, 307a: source region, 307b: drain region, 312: gate insulating film, 316: a pair of electrodes, 404: gate electrode, 405a: region, 405b: region, 405c: region, 406: oxide semiconductor film, 407a: region, 407b: region, 504: gate electrode, 505: channel region, 506: oxide semiconductor film, 507a: source region, 507b: drain region, 512: gate insulating film, 516: a pair of electrodes, 604: gate electrode, 605: channel region, 606: oxide semiconductor film, 607a: source region, 607b: drain region, 612: gate insulating film, 616: a pair of electrodes, 618: interlayer insulating film, 704: gate electrode, 705: channel region, 706: oxide semiconductor film, 707a: source region, 707b: drain region, 712: gate insulating film, 716: a pair of electrodes, 718: interlayer insulating film, 1141: switching element, 1142: memory element, 1143: memory element group, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 2200: pixel, 2210: liquid crystal element, 2220: capacitor, 2230: transistor, 3006: oxide semiconductor film, 3010: microvoid, 5001: spectrum, 5002: spectrum, 5003: spectrum, 5004: spectrum, 5011: solid line, 5012: solid line, 5013: solid line, 5014: solid line, 5021: solid line, 5022: solid line, 5023: solid line, 5024: solid line, 9300: housing, 9301: button, 9302: microphone, 9303: display portion, 9304: speaker, 9305: camera, 9310: housing, 9311: display portion, 9320: housing, 9321: button, 9322: microphone, 9323: display portion.

This application is based on Japanese Patent Application serial no. 2011-060152 filed with Japan Patent Office on Mar. 18, 2011, the entire contents of which are hereby incorporated by reference.

The invention claimed is:

1. A manufacturing method of a semiconductor device, the method comprising the steps of:
   forming a gate electrode;
   forming a gate insulating film over the gate electrode;
   forming an oxide semiconductor film and a pair of electrodes over the gate electrode with the gate insulating film therebetween, the pair of electrodes being in contact with the oxide semiconductor film;
   forming a microvoid by adding oxygen to parts of the oxide semiconductor film to form a source region, a drain region, and a channel region; and
   performing heat treatment at a temperature higher than or equal to 200° C. and lower than or equal to 700° C. after forming the microvoid.

2. A manufacturing method of a semiconductor device according to claim 1, further comprising the step of:
   forming an interlayer insulating film over the oxide semiconductor film and the pair of electrodes before performing the heat treatment.

3. A manufacturing method of a semiconductor device according to claim 1, further comprising the steps of:
   forming an interlayer insulating film over the oxide semiconductor film,
   forming a first opening and a second opening exposing the oxide semiconductor film in the interlayer insulating film; and
   wherein one of the pair of electrodes is in contact with the oxide semiconductor film through the first opening and the other of the pair of electrodes is in contact with the oxide semiconductor film through the second opening.

4. A manufacturing method of a semiconductor device according to claim 1,
   wherein the pair of electrodes is formed over the oxide semiconductor film.

5. A manufacturing method of a semiconductor device according to claim 1,
   wherein the oxide semiconductor film is formed over the pair of electrodes.

6. A manufacturing method of a semiconductor device according to claim 1,
   wherein the step of forming the microvoid is performed before the step of forming the pair of electrodes.

7. A manufacturing method of a semiconductor device according to claim 1,
   wherein the step of forming the microvoid is performed after the step of forming the pair of electrodes.

8. A manufacturing method of a semiconductor device according to claim 1,
   wherein the microvoid is formed by an ion implantation or ion doping using at least one of nitrogen, oxygen, and hydrogen to the part of the oxide semiconductor film.

9. A manufacturing method of a semiconductor device, the method comprising the steps of:
   forming an oxide semiconductor film and a pair of electrodes, the pair of electrodes being in contact with the oxide semiconductor film;
   forming a microvoid by adding oxygen to parts of the oxide semiconductor film to form a source region, a drain region, and a channel region;
   forming a gate insulating film over the oxide semiconductor film and the pair of electrodes;
   forming a gate electrode overlapping with the oxide semiconductor film with the gate insulating film provided therebetween; and
   performing heat treatment at a temperature higher than or equal to 200° C. and lower than or equal to 700° C. after forming the gate electrode,
   wherein the microvoid includes at least one of nitrogen, hydrogen, and oxygen more than an outside of the microvoid includes.

10. A manufacturing method of a semiconductor device according to claim 9, further comprising the steps of:
    forming an interlayer insulating film over the gate electrode; and
    forming a first opening and a second opening exposing the oxide semiconductor film in the interlayer insulating film,
    wherein one of the pair of electrodes is in contact with the oxide semiconductor film through the first opening and the other of the pair of electrodes is in contact with the oxide semiconductor film through the second opening,
    wherein the step of forming the microvoid is performed by using the gate electrode as a mask;
    wherein the step of forming the first opening and the second opening is performed after the step of performing the heat treatment, and
    wherein the step of forming the pair of electrodes is performed after the step of forming the first opening and the second opening.

11. A manufacturing method of a semiconductor device according to claim 9,
    wherein the step of forming the microvoid is performed after the step of forming the pair of electrodes.

12. A manufacturing method of a semiconductor device according to claim 9,
    wherein the pair of electrodes is formed over the oxide semiconductor film.

13. A manufacturing method of a semiconductor device according to claim 9,
    wherein the oxide semiconductor film is formed over the pair of electrodes.

14. A manufacturing method of a semiconductor device according to claim 9,
    wherein the step of forming the microvoid is performed before the step of forming the pair of electrodes.

15. A manufacturing method of a semiconductor device according to claim 9,
    wherein the microvoid is formed by an ion implantation or ion doping using at least one of nitrogen, oxygen, and hydrogen to the part of the oxide semiconductor film.

* * * * *